United States Patent
Regan et al.

(10) Patent No.: US 11,763,045 B2
(45) Date of Patent: *Sep. 19, 2023

(54) GENERATION OF TOOL PATHS FOR SHOE ASSEMBLY

(71) Applicant: NIKE, Inc., Beaverton, OR (US)

(72) Inventors: Patrick Conall Regan, Taichung (TW); Dragan Jurkovic, Taichung (TW); Chih-Chi Chang, Douliu (TW); Ming-Feng Jean, Douliu (TW)

(73) Assignee: NIKE, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/728,402

(22) Filed: Apr. 25, 2022

(65) Prior Publication Data

US 2022/0245293 A1    Aug. 4, 2022

Related U.S. Application Data

(63) Continuation of application No. 16/733,008, filed on Jan. 2, 2020, now Pat. No. 11,341,291, which is a
(Continued)

(51) Int. Cl.
*G06F 30/13* (2020.01)
*G05B 19/4097* (2006.01)
(Continued)

(52) U.S. Cl.
CPC ......... *G06F 30/13* (2020.01); *G05B 19/4097* (2013.01); *A43D 1/08* (2013.01);
(Continued)

(58) Field of Classification Search
None
See application file for complete search history.

(56) References Cited

U.S. PATENT DOCUMENTS 3,220,723 A   11/1965  Jacob
3,357,091 A   12/1967  Reissmueller et al.
(Continued)

FOREIGN PATENT DOCUMENTS

CA    2790521 A1    9/2011
CA    2791913 A1    9/2011
(Continued)

OTHER PUBLICATIONS

Zhongxu Hu et al, "Computer vision for shoe upper profile measurement via upper and sole conformal matching", 2007, ScienceDirect, Optics and Lasers in Engineering 45 (2007) 183-190 (Year: 2007).*
(Continued)

*Primary Examiner* — Akash Saxena
(74) *Attorney, Agent, or Firm* — SHOOK, HARDY & BACON, LLP

(57) ABSTRACT

A tool path for treating a shoe upper may be generated to treat substantially only the surface of the shoe bounded by a bite line. The bite line may be defined to correspond to the junction of the shoe upper and a shoe bottom unit. Bite line data and three-dimensional profile data representing at least a portion of a surface of a shoe upper bounded by a bite line may be utilized in combination to generate a tool path for processing the surface of the upper, such as automated application of adhesive to the surface of a lasted upper bounded by a bite line.

14 Claims, 13 Drawing Sheets

Related U.S. Application Data continuation of application No. 14/084,365, filed on Nov. 19, 2013, now Pat. No. 10,552,551, which is a continuation-in-part of application No. 13/299,827, filed on Nov. 18, 2011, now Pat. No. 8,849,620.

(51) Int. Cl.

| | | |
|---|---|---|
| *G06T 17/00* | (2006.01) | |
| *G06T 7/521* | (2017.01) | |
| *A43D 1/08* | (2006.01) | |
| *G06T 19/00* | (2011.01) | |
| *G06F 30/00* | (2020.01) | |
| *A43D 95/00* | (2006.01) | |
| *B25J 9/16* | (2006.01) | |
| *G05B 19/4093* | (2006.01) | |
| *A43D 8/00* | (2006.01) | |
| *A43D 8/32* | (2006.01) | |
| *A43D 25/06* | (2006.01) | |

(52) U.S. Cl.
CPC ............ *A43D 8/00* (2013.01); *A43D 8/32* (2013.01); *A43D 25/06* (2013.01); *A43D 95/00* (2013.01); *B25J 9/1684* (2013.01); *G05B 19/4093* (2013.01); *G05B 2219/37205* (2013.01); *G05B 2219/39393* (2013.01); *G05B 2219/45243* (2013.01); *G06F 30/00* (2020.01); *G06T 7/521* (2017.01); *G06T 17/00* (2013.01); *G06T 19/00* (2013.01)

(56) References Cited

U.S. PATENT DOCUMENTS

| | | | |
|---|---|---|---|
| 3,464,102 | A | 9/1969 | Soloff |
| 3,848,752 | A | 11/1974 | Branch et al. |
| 4,010,502 | A | 3/1977 | Cushing et al. |
| 4,041,620 | A | 8/1977 | Anderson |
| 4,100,864 | A * | 7/1978 | Babson ............... D05B 35/102 112/153 |
| 4,131,918 | A * | 12/1978 | Pettit ............... G05B 19/16 409/84 |
| 4,238,524 | A * | 12/1980 | LaLiberte ............ C09D 11/037 8/507 |
| 4,304,020 | A | 12/1981 | Bonnet et al. |
| 4,315,181 | A | 2/1982 | Holze, Jr. |
| 4,389,064 | A | 6/1983 | Laverriere |
| 4,452,057 | A | 6/1984 | Davies et al. |
| 4,472,783 | A | 9/1984 | Johnstone et al. |
| 4,639,963 | A | 2/1987 | Fisher |
| 4,671,755 | A | 6/1987 | Graae |
| 4,745,290 | A * | 5/1988 | Frankel ............. G05B 19/4207 12/146 L |
| 4,765,011 | A | 8/1988 | Leeper |
| 4,769,866 | A | 9/1988 | Williams |
| 4,775,290 | A | 10/1988 | Brown et al. |
| 4,803,735 | A | 2/1989 | Nishida et al. |
| 4,866,802 | A | 9/1989 | Stein et al. |
| 4,996,012 | A | 2/1991 | Gierschewski et al. |
| 5,027,281 | A * | 6/1991 | Rekow ............... A61C 13/0004 700/182 |
| 5,036,935 | A | 8/1991 | Kohara |
| 5,050,919 | A | 9/1991 | Yakou |
| 5,083,518 | A * | 1/1992 | Ciucani ............... D05B 15/02 112/49 |
| 5,105,564 | A | 4/1992 | Motoda |
| 5,135,569 | A * | 8/1992 | Mathias ............... C09D 11/50 106/31.47 |
| 5,148,591 | A | 9/1992 | Pryor |
| 5,172,326 | A * | 12/1992 | Campbell, Jr. ......... B26D 5/00 700/134 |
| 5,194,289 | A * | 3/1993 | Butland ............... A61B 5/1172 427/160 |
| 5,218,427 | A | 6/1993 | Koch |
| 5,231,470 | A | 7/1993 | Koch |
| 5,255,352 | A * | 10/1993 | Falk ............... G06T 15/04 345/582 |
| 5,259,468 | A | 11/1993 | Warren et al. |
| 5,377,011 | A | 12/1994 | Koch |
| 5,414,617 | A | 5/1995 | Pomerleau et al. |
| 5,427,301 | A | 6/1995 | Pham et al. |
| 5,506,682 | A | 4/1996 | Pryor |
| 5,608,847 | A | 3/1997 | Pryor |
| 5,609,377 | A | 3/1997 | Tanaka |
| 5,671,055 | A | 9/1997 | Whittlesey et al. |
| 5,768,732 | A | 6/1998 | Blanc |
| 5,772,100 | A | 6/1998 | Patrikios |
| 5,781,951 | A | 7/1998 | Federico |
| 5,784,737 | A | 7/1998 | Tsuji |
| 5,807,449 | A * | 9/1998 | Hooker ............... A43D 25/183 118/682 |
| 5,819,016 | A | 10/1998 | Watanabe et al. |
| 5,836,428 | A | 11/1998 | Young |
| 5,876,550 | A | 3/1999 | Feygin et al. |
| 5,920,395 | A | 7/1999 | Schulz |
| 5,968,297 | A * | 10/1999 | Hooker ............... A43D 117/00 156/356 |
| 6,009,359 | A | 12/1999 | El-hakim et al. |
| 6,051,028 | A | 4/2000 | Mccartney et al. |
| 6,073,043 | A | 6/2000 | Schneider |
| 6,098,313 | A | 8/2000 | Skaja |
| 6,127,822 | A | 10/2000 | Sasahara et al. |
| 6,293,677 | B1 * | 9/2001 | Gallucci ............... B26F 1/3813 353/28 |
| 6,299,962 | B1 | 10/2001 | Davis |
| 6,301,763 | B1 | 10/2001 | Pryor |
| 6,349,241 | B1 | 2/2002 | Peron et al. |
| 6,438,780 | B1 | 8/2002 | Hansen et al. |
| 6,449,878 | B1 | 9/2002 | Lyden |
| 6,473,667 | B1 | 10/2002 | Lee |
| 6,533,885 | B2 | 3/2003 | Davis et al. |
| 6,599,381 | B2 | 7/2003 | Urlaub et al. |
| 6,611,617 | B1 | 8/2003 | Crampton |
| 6,672,576 | B1 | 1/2004 | Walker |
| 6,718,604 | B1 | 4/2004 | Taga et al. |
| 6,721,444 | B1 | 4/2004 | Gu et al. |
| 6,765,572 | B2 | 7/2004 | Roelofs |
| 6,771,840 | B1 * | 8/2004 | Ioannou ............... G01S 17/89 382/285 |
| 6,779,032 | B1 | 8/2004 | Hericourt |
| 6,816,755 | B2 | 11/2004 | Habibi et al. |
| 6,823,763 | B1 | 11/2004 | Foster et al. |
| 6,867,772 | B2 | 3/2005 | Kotcheff et al. |
| 6,900,450 | B2 | 5/2005 | Gimenez et al. |
| 6,952,204 | B2 | 10/2005 | Baumberg et al. |
| 6,979,032 | B2 | 12/2005 | Damhuis |
| 7,065,242 | B2 | 6/2006 | Petrov |
| 7,079,114 | B1 | 7/2006 | Smith et al. |
| 7,107,235 | B2 | 9/2006 | Lyden |
| 7,204,043 | B2 | 4/2007 | Kilgore |
| 7,296,834 | B2 | 11/2007 | Clark et al. |
| 7,387,627 | B2 | 6/2008 | Erb et al. |
| 7,446,733 | B1 | 11/2008 | Hirimai |
| 7,476,289 | B2 | 1/2009 | White |
| 7,481,472 | B2 | 1/2009 | Cawley et al. |
| 7,620,235 | B2 * | 11/2009 | Daniel ............... G01S 17/46 345/426 |
| 7,657,100 | B2 | 2/2010 | Gokturk et al. |
| 7,717,482 | B2 | 5/2010 | Iwasaki |
| 7,881,896 | B2 | 2/2011 | Atwell et al. |
| 7,882,585 | B2 | 2/2011 | Cheung |
| 7,945,343 | B2 | 5/2011 | Jones et al. |
| 7,991,576 | B2 | 8/2011 | Roumeliotis |
| 8,005,558 | B2 | 8/2011 | Waatti et al. |
| 8,035,052 | B2 | 10/2011 | De La Ballina et al. |
| 8,107,721 | B2 * | 1/2012 | Beardsley ............. G06T 7/586 382/154 |
| 8,143,494 | B2 | 3/2012 | Eby |
| 8,220,335 | B2 | 7/2012 | Dubois et al. |
| 8,233,667 | B2 | 7/2012 | Helgason et al. |
| 8,545,743 | B2 | 10/2013 | Spanks et al. |
| 8,755,925 | B2 | 6/2014 | Regan et al. |

(56) References Cited

U.S. PATENT DOCUMENTS

| | | | |
|---|---|---|---|
| 8,849,620 B2* | 9/2014 | Regan | A43D 8/00 702/167 |
| 8,958,901 B2 | 2/2015 | Regan | |
| 8,966,775 B2* | 3/2015 | Regan | A43D 1/08 33/3 R |
| 9,084,451 B2 | 7/2015 | Regan et al. | |
| 9,237,780 B2* | 1/2016 | Jurkovic | A43D 8/16 |
| 9,339,079 B2 | 5/2016 | Lucas et al. | |
| 9,447,532 B2 | 9/2016 | Jurkovic et al. | |
| 9,451,810 B2* | 9/2016 | Regan | A43D 111/006 |
| 9,668,545 B2* | 6/2017 | Jurkovic | A43D 8/26 |
| 10,194,716 B2 | 2/2019 | Regan et al. | |
| 10,241,498 B1* | 3/2019 | Beard | B33Y 50/02 |
| 10,334,209 B2* | 6/2019 | Fu | G06T 7/80 |
| 10,393,512 B2* | 8/2019 | Regan | G06F 30/00 |
| 11,138,810 B2* | 10/2021 | Huang | G06T 19/20 |
| 2001/0010249 A1 | 8/2001 | Mcnichols | |
| 2001/0020222 A1 | 9/2001 | Lee et al. | |
| 2001/0042321 A1* | 11/2001 | Tawney | A43B 13/20 36/43 |
| 2001/0045755 A1 | 11/2001 | Schick et al. | |
| 2002/0024677 A1* | 2/2002 | Metcalfe | G01B 11/245 356/625 |
| 2002/0063744 A1* | 5/2002 | Stephens, Jr. | G06K 5/02 347/19 |
| 2002/0153735 A1 | 10/2002 | Kress | |
| 2002/0193909 A1 | 12/2002 | Parker et al. | |
| 2003/0038822 A1* | 2/2003 | Raskar | G01B 11/2504 345/632 |
| 2003/0062110 A1 | 4/2003 | Urlaub et al. | |
| 2003/0110582 A1 | 6/2003 | Torielli et al. | |
| 2003/0139848 A1 | 7/2003 | Cifra et al. | |
| 2003/0160084 A1 | 8/2003 | Higashiyama | |
| 2003/0189114 A1 | 10/2003 | Taylor et al. | |
| 2003/0231793 A1 | 12/2003 | Crampton | |
| 2003/0231797 A1 | 12/2003 | Cullen et al. | |
| 2004/0022426 A1 | 2/2004 | Carbone et al. | |
| 2004/0034963 A1 | 2/2004 | Rogers et al. | |
| 2004/0172164 A1 | 9/2004 | Habibi et al. | |
| 2004/0212205 A1 | 10/2004 | Linker, II et al. | |
| 2005/0050669 A1 | 3/2005 | Castello | |
| 2005/0135670 A1* | 6/2005 | Vaidyanathan | G06T 7/593 382/154 |
| 2005/0154485 A1 | 7/2005 | Popp et al. | |
| 2006/0041448 A1 | 2/2006 | Patterson et al. | |
| 2006/0082590 A1 | 4/2006 | Stevick et al. | |
| 2006/0109481 A1 | 5/2006 | Gallup | |
| 2006/0143839 A1 | 7/2006 | Fromme | |
| 2006/0155417 A1 | 7/2006 | Cremaschi et al. | |
| 2006/0196332 A1 | 9/2006 | Downing et al. | |
| 2006/0197126 A1 | 9/2006 | Lochtefeld et al. | |
| 2006/0221072 A1 | 10/2006 | Se et al. | |
| 2006/0266593 A1 | 11/2006 | Cerreto et al. | |
| 2007/0156362 A1 | 7/2007 | Goode et al. | |
| 2007/0163147 A1* | 7/2007 | Cavanagh | A61B 5/6807 36/44 |
| 2007/0228751 A1 | 10/2007 | Viavattine et al. | |
| 2007/0290517 A1 | 12/2007 | Nagai et al. | |
| 2008/0074055 A1* | 3/2008 | Peterson | H05B 41/32 315/241 P |
| 2008/0139126 A1 | 6/2008 | Lee et al. | |
| 2008/0143048 A1* | 6/2008 | Shigeta | A63F 1/18 273/149 R |
| 2008/0147219 A1* | 6/2008 | Jones | A43B 1/0054 700/95 |
| 2008/0189194 A1 | 8/2008 | Bentvelzen | |
| 2008/0192263 A1 | 8/2008 | Wienand et al. | |
| 2008/0197126 A1 | 8/2008 | Bourke et al. | |
| 2009/0287452 A1 | 11/2009 | Stanley et al. | |
| 2009/0293313 A1* | 12/2009 | Bruce | A43B 3/0078 36/103 |
| 2010/0036753 A1 | 2/2010 | Harvill et al. | |
| 2010/0040450 A1 | 2/2010 | Parnell | |
| 2010/0149178 A1 | 6/2010 | Yokoyama et al. | |
| 2010/0238271 A1* | 9/2010 | Pfeiffer | A43D 1/06 348/E13.001 |
| 2010/0243030 A1 | 9/2010 | Yago | |
| 2011/0000299 A1 | 1/2011 | Isobe et al. | |
| 2011/0061265 A1 | 3/2011 | Lyden | |
| 2011/0123359 A1 | 5/2011 | Schaaf | |
| 2011/0166694 A1 | 7/2011 | Griffits et al. | |
| 2011/0172797 A1 | 7/2011 | Jones et al. | |
| 2011/0232008 A1* | 9/2011 | Crisp | G06Q 10/06 12/18.1 |
| 2011/0264138 A1 | 10/2011 | Avelar et al. | |
| 2011/0278870 A1 | 11/2011 | Omiya et al. | |
| 2011/0292406 A1 | 12/2011 | Hollenbeck et al. | |
| 2012/0059517 A1 | 3/2012 | Nomura | |
| 2012/0062706 A1* | 3/2012 | Keshavmurthy | G01S 17/89 348/47 |
| 2012/0126554 A1 | 5/2012 | Becker et al. | |
| 2012/0287253 A1 | 11/2012 | Makover et al. | |
| 2013/0004289 A1 | 1/2013 | Gaudette | |
| 2013/0030773 A1 | 1/2013 | Ohare | |
| 2013/0111731 A1 | 5/2013 | Onishi | |
| 2013/0125319 A1 | 5/2013 | Regan | |
| 2013/0126067 A1 | 5/2013 | Regan et al. | |
| 2013/0127192 A1 | 5/2013 | Regan et al. | |
| 2013/0127193 A1 | 5/2013 | Regan et al. | |
| 2013/0131853 A1 | 5/2013 | Regan et al. | |
| 2013/0131854 A1* | 5/2013 | Regan | A43D 11/00 700/114 |
| 2013/0131865 A1 | 5/2013 | Yamane | |
| 2013/0132038 A1* | 5/2013 | Regan | A43D 8/00 703/1 |
| 2013/0174445 A1 | 7/2013 | Hakkala et al. | |
| 2014/0081441 A1* | 3/2014 | Regan | G05B 19/4097 700/98 |
| 2014/0096403 A1* | 4/2014 | Regan | A43D 25/06 33/6 |
| 2014/0196307 A1 | 7/2014 | Fremming et al. | |
| 2014/0237737 A1 | 8/2014 | Regan et al. | |
| 2014/0362079 A1 | 12/2014 | Regan et al. | |
| 2015/0135447 A1* | 5/2015 | Jurkovic | A43D 25/06 12/145 |
| 2015/0139555 A1 | 5/2015 | Jung et al. | |
| 2015/0201709 A1* | 7/2015 | Jurkovic | A43D 25/06 702/155 |
| 2015/0261202 A1 | 9/2015 | Regan | |
| 2015/0298320 A1 | 10/2015 | Eisele et al. | |
| 2015/0320138 A1* | 11/2015 | McDowell | G06F 17/00 700/119 |
| 2015/0374073 A1 | 12/2015 | Regan et al. | |
| 2016/0128434 A1* | 5/2016 | Jurkovic | A43D 25/06 12/145 |
| 2016/0316859 A1 | 11/2016 | Regan et al. | |
| 2017/0105490 A1* | 4/2017 | Makover | G06T 19/20 |
| 2017/0178379 A1* | 6/2017 | Fu | G06Q 10/043 |
| 2017/0308066 A1 | 10/2017 | Farren et al. | |
| 2018/0129185 A1 | 5/2018 | Jurkovic et al. | |
| 2018/0299860 A1 | 10/2018 | Regan | |
| 2019/0133258 A1 | 5/2019 | Regan et al. | |
| 2019/0360797 A1* | 11/2019 | Regan | A43D 1/08 |
| 2020/0143091 A1 | 5/2020 | Regan et al. | |
| 2020/0234510 A1* | 7/2020 | Huang | G06T 19/20 |

FOREIGN PATENT DOCUMENTS

| | | |
|---|---|---|
| CN | 85108140 A | 4/1986 |
| CN | 1293752 A | 5/2001 |
| CN | 1384704 A | 12/2002 |
| CN | 1505997 A | 6/2004 |
| CN | 1576829 A | 2/2005 |
| CN | 1753611 A | 3/2006 |
| CN | 1831687 A | 9/2006 |
| CN | 2865565 Y | 2/2007 |
| CN | 2877375 Y | 3/2007 |
| CN | 101040184 A | 9/2007 |
| CN | 101076266 A | 11/2007 |
| CN | 101161151 A | 4/2008 |
| CN | 101339640 A | 1/2009 |
| CN | 101388118 A | 3/2009 |

(56) References Cited

FOREIGN PATENT DOCUMENTS

| | | |
|---|---|---|
| CN | 101588736 A | 11/2009 |
| CN | 201349600 Y | 11/2009 |
| CN | 101794461 A | 8/2010 |
| CN | 101823179 A | 9/2010 |
| CN | 101847173 A | 9/2010 |
| CN | 102076269 A | 5/2011 |
| CN | 102157013 A | 8/2011 |
| CN | 102203550 A | 9/2011 |
| CN | 102223815 A | 10/2011 |
| CN | 103153110 A | 6/2013 |
| DE | 3817615 A1 | 8/1989 |
| DE | 4020358 C1 | 8/1991 |
| DE | 10343620 A1 | 4/2005 |
| DE | 102009042303 A1 | 3/2011 |
| EP | 0123173 A2 | 10/1984 |
| EP | 0340390 A2 | 11/1989 |
| EP | 0348311 A1 | 12/1989 |
| EP | 0422946 A1 | 4/1991 |
| EP | 0512773 A1 | 11/1992 |
| EP | 0572123 A2 | 12/1993 |
| EP | 0610610 A1 | 8/1994 |
| EP | 0689778 A1 | 1/1996 |
| EP | 0780065 A1 | 6/1997 |
| EP | 0790010 A1 | 8/1997 |
| EP | 0840880 A1 | 5/1998 |
| EP | 0790010 B1 | 4/2001 |
| EP | 1544800 A2 | 6/2005 |
| EP | 2060348 B1 | 2/2011 |
| ES | 1034276 U | 12/1996 |
| ES | 2142239 A1 | 4/2000 |
| FR | 2911255 A1 | 7/2008 |
| GB | 699299 A | 11/1953 |
| GB | 699299 A * | 11/1953 |
| GB | 2140345 A | 11/1984 |
| JP | H05337002 A | 12/1993 |
| JP | 6-195823 A | 7/1994 |
| JP | 6-198523 A | 7/1994 |
| JP | 2002-217251 A | 8/2002 |
| JP | 2005-228150 A | 8/2005 |
| JP | 2011-143497 A | 7/2011 |
| JP | 6-198523 B2 | 9/2017 |
| KR | 10-2005-0090168 A | 9/2005 |
| KR | 10-0656743 B1 | 12/2006 |
| TW | 308528 B | 6/1997 |
| TW | 486614 B | 5/2002 |
| TW | 200907826 A | 2/2009 |
| TW | 200916725 A | 4/2009 |
| TW | 200925546 A | 6/2009 |
| TW | 200939053 A | 9/2009 |
| TW | 200951399 A | 12/2009 |
| TW | 201017092 A | 5/2010 |
| TW | 201128569 A | 8/2011 |
| WO | 91/11885 A1 | 8/1991 |
| WO | 97/27451 A1 | 7/1997 |
| WO | 98/30121 A1 | 7/1998 |
| WO | 99/12440 A2 | 3/1999 |
| WO | 99/55186 A1 | 11/1999 |
| WO | 00/36943 A1 | 6/2000 |
| WO | 2004/062842 A1 | 7/2004 |
| WO | 2008/044943 A1 | 4/2008 |
| WO | 2009050238 A1 | 4/2009 |
| WO | 2010/014750 A1 | 2/2010 |
| WO | 2010/034044 A2 | 4/2010 |
| WO | 2011/064138 A1 | 6/2011 |

OTHER PUBLICATIONS

C. Wu et al, "Implementation of 5-DOF apparatus used for adhesive spray and roughing of shoe upper," IEEE International Conference on Automation and Logistics (ICAL), pp. 13, 2008. (Year: 2008).*

Intention to Grant received for European Application No. 18202180.8 dated Jan. 2, 2023, 6 pages.

Notice of Allowance received for U.S. Appl. No. 17/587,506, dated Jan. 25, 2023, 9 pages.

Intention to Grant received for European Patent Application No. 19185101.3, dated Nov. 16, 2022, 5 pages.

Akella, S., "Robotic Manipulation for Parts Transfer and Orienting", Dec. 1996,The Robotics Institute Carnegie Mellon University Pittsburgh, Pennsylvania 15213, 1996, pp. 1-171.

Hu et al., "Automatic Surface Roughing With 3D Machine Vision and Cooperative Robot Control", Robotics and Autonomous Systems, vol. 55, No. 7, Feb. 15, 2017, pp. 552-560.

Hu et al., "Computer Vision for Shoe Upper Profile Measurement via Upper and Sole Conformal Matching", Optics and Lasers in Engineering, vol. 45, No. 1, Jan. 2007, pp. 183-190.

J, Y Kim., "CAD-Based Automated Robot Programming in Adhesive Spray Systems for Shoe Outsoles and Uppers", Wiley Periodicals Inc., Journal of Robotic Systems 21 (11), Available online at: <https://onlinelibrary.wiley.com/action/doSearch?AllField=CAD-Based+Automated+Robot+Programming+in+Adhesive+Spray+Systems+for+Shoe+Outsoles+and+Uppers>, 2004, pp. 625-634.

Jin et al., "Detection of 3D Curve for Shoe Sole Spraying Based on Laser Triangulation Measurement", Proceedings of the IEEE International Conference on Automation and Logistics Shenyang, China, Aug. 5, 2009, pp. 865-868.

Nemec et al., "Automation in Shoe Assembly", Jozef Stefan Institute, Available online at: <http://conf.uni-obuda.hu/raad2006/Nemec.pdf>, 2006, 5 pages.

Nemec et al., "Automation of Lasting Operation in Shoe Production Industry", IEEE International Conference on Industrial Technology, vol. 1, Dec. 10-12, 2003, pp. 462-465.

"User Manual Pages—3D Laser Scanning", David Wiki, Feb. 20, 2009, 6 pages.

"User Manual Pages—Frequently Asked Questions", David Wiki, Feb. 15, 2009, 3 pages.

Wu et al., "Implementation of 5-DOF Apparatus Used for Adhesive Spray and Roughing of Shoe Upper", IEEE, International Conference on Automation and Logistics Qingdao, China, Sep. 2008, pp. 1408-1413.

Extended European Search Report received for European Applicaton No. 22167398.1, dated Aug. 31, 2022, 9 pages.

Non-Final Office Action received for U.S. Appl. No. 17/587,506, dated Sep. 14, 2022, 12 pages.

Notice of Allowance received for U.S. Appl. No. 16/846,129, dated May 31, 2022, 7 pages.

Non-Final Office Action received for U.S. Appl. No. 17/734,842, dated May 31, 2023, 13 pages.

* cited by examiner

GENERATION OF TOOL PATHS FOR SHOE ASSEMBLY

CROSS-REFERENCE TO RELATED APPLICATIONS AND PRIORITY CLAIM

This application is a continuation of co-pending U.S. patent application Ser. No. 16/733,008, filed on Jan. 2, 2020, and titled "Generation of Tool Paths for Shoe Assembly," which is a continuation of U.S. patent application Ser. No. 14/084,365, filed on Nov. 19, 2013, and titled "Generation of Tool Paths for Shoe Assembly," now issued as U.S. Pat. No. 10,552,551, which is a continuation-in-part of U.S. patent application Ser. No. 13/299,827, filed on Nov. 18, 2011, and titled "Automated 3-D Modeling of Shoe Parts," now issued as U.S. Pat. No. 8,849,620, all of which are incorporated herein by reference in the entirety.

This application is also related by subject matter to U.S. patent application Ser. No. 14/084,359, filed on Nov. 19, 2013, and titled "Conditionally Visible Bite Lines for Footwear," now issued as U.S. Pat. No. 9,237,780, which is also incorporated herein by reference in the entirety.

TECHNICAL FIELD

Aspects hereof relate to the automated manufacturing of articles of footwear. More particularly, aspects hereof relate to the generation of tool paths for the processing of parts in the automated manufacturing of shoes.

BACKGROUND

Because of the pliable and bending nature of many materials typically used in manufacturing articles of footwear, and, more particularly, athletic shoes, the automated processing of shoe parts in the manufacturing process poses difficulties. The inherent properties of materials used in constructing articles of footwear, and, more particularly, athletic shoes, results in the optimal tool paths for performing processes on shoe parts or partially assembled shoe parts varying from shoe to shoe. Because of the performance demands and consumer expectations for shoes, particularly athletic shoes, even a small deviation from an optimal tool path may result in an unacceptable shoe or a shoe that will fail under anticipated wear conditions. For example, the application of adhesives to join a shoe upper to a corresponding bottom unit (e.g., a joined midsole and outsole assembly) must be performed at the appropriate locations on the portions of the shoe upper that will contact the corresponding bottom unit. Inadequate coverage of the desired portions of the shoe upper may lead to the failure of the resulting shoe due to the separation of the bottom unit from the upper. While the potential for failure may be addressed by applying an increased amount of adhesives, the over-use of an adhesive is wasteful, expensive, potentially detrimental to the resulting bonding strength because of an incomplete curing process, and potentially damaging to the environment. Further, applying an increased amount of adhesive may lead to the presence of adhesive material outside of the desired adhesive area, which may result in the discoloration or soiling of the shoe, rendering the shoe unacceptable to consumers. For reasons such as these, many aspects of the manufacturing of shoes has remained an intensively manual process.

BRIEF SUMMARY

Aspects hereof generally relate to the automated generation of tool paths for the processing of parts during the automated manufacturing of articles of footwear. More particularly, aspects hereof relate to the generation of tool paths for the application of adhesives to a shoe upper for use in joining the shoe upper to a corresponding bottom unit or sole assembly. Systems and methods in accordance herewith may be used for the generation of tool paths for tools other than adhesive applicators, such as buffers, primers, cleaners, painters, and the like. Such tools may clean, prepare, or otherwise treat a portion, but generally not all, of a shoe part. Further, systems and methods in accordance herewith may be used for generating tool paths for components beyond shoe uppers and shoe sole assemblies.

Systems and methods in accordance herewith may demarcate a bite line to indicate a first surface region on a shoe upper. A shoe upper may be lasted and retained against a corresponding bottom unit or, more likely, a representation thereof, with a predetermined amount of force. (It should be noted that, in processing, a representation of a corresponding bottom unit often may be utilized rather than the bottom unit itself so that a single bottom unit representation may be utilized to process a plurality of shoe uppers.) Force may be applied to the lasted upper at one or more points using one or more mechanisms. Force may alternatively or additionally be applied to the bottom unit representation corresponding to the lasted upper. A bottom unit may comprise a single item or a plurality of items, such as an outsole and a midsole layer, potentially with additional components to provide cushioning, motion control, etc. The amount of pressure applied to retain the lasted upper against the corresponding bottom unit representation may vary based upon the types of materials used in both the upper and the corresponding bottom unit upon shoe assembly, the strength of the bond desired, the types of bonding material to be used, and the amount of force anticipated to be applied during the bonding process, or other considerations. In many examples, the predetermined amount of force used to retain the lasted upper against a corresponding bottom unit representation during the demarcation of a bite line will be the same or similar to the amount of force applied to adhere the lasted upper to the corresponding bottom unit during subsequent manufacturing steps in order for the bite line to accurately correspond to the junction point between the upper and the bottom unit after bonding.

The demarcated bite line generally corresponds to the junction of the lasted upper and the bottom unit representation when retained together with the predetermined amount of force. The bite line thus marked may define at least a first surface region and a second surface region on the surface of the lasted upper. The first surface region defined on the surface of the lasted shoe upper may be bounded by the bite line and may correspond to the portion of the surface of the lasted shoe upper that is covered by the bottom unit representation when the lasted shoe upper is retained against the bottom unit representation with a predetermined amount of force. The second surface region defined by the bite line may correspond to the portions of the surface of the lasted upper that are not covered by the bottom unit representation when the lasted upper is retained against the bottom unit representation with a predetermined amount of force. Ultimately, an adhesive may be applied substantially within the first surface region, but not to the second surface region using one or more tool paths that may be generated using systems and methods in accordance herewith.

A bite line marked in accordance with systems and methods hereof may take a variety of forms. For example, a bite line may be marked by forming indicia on the lasted shoe upper while the lasted shoe upper is retained against the corresponding bottom unit representation with a predetermined amount of force. A pen, pencil, scribing tool that produces an indentation in the material of the upper, or any other type of mark may be used to create such a perceivable bite line. A perceivable bite line may be visible to a human and/or to a computer vision system using at least one camera in the detection of the perceivable bite line. In some examples, a perceivable bite line may be a conditionally visible bite line. For example, a fluorescent marking agent, such as a fluorescent ink, or an Infrared (IR) marking agent, that is not perceptible to human eyes under normal lighting conditions may be used to create indicia on the lasted shoe upper to form a conditionally perceivable bite line. By using selected illumination, such as a black light or IR light, as appropriate, the resulting indicia of the bite line may be perceived by at least one camera and/or human operators during the manufacturing process, without risking the discoloration of a shoe to render it unacceptable to ultimate consumers viewing the shoe under typical lighting conditions. In aspects, conditionally visible indicia illuminated by light of an appropriate spectrum may be detected by a first camera and a second camera, images from the first and second cameras being combined to create the resulting bite line data.

Other examples of bite lines in accordance herewith may comprise virtual bite lines that do not leave physical indicia on the lasted shoe upper. For example, a stylus used in conjunction with a three-dimensional representation system may be moved along the junction between the lasted shoe upper and the corresponding bottom unit representation to create a virtual bite line. Another example of the creation of a virtual bite line may utilize a light source projected across the lasted shoe upper, the corresponding bottom unit representation, and the junction of the lasted shoe upper and corresponding bottom unit representation. The discontinuity in the reflection of the light at the junction between the upper surface and the bottom unit surface may be used to generate a virtual bite line. However created, data representing a virtual bite line may be stored in a computer-readable media and used in accordance with aspects hereof as one measure representing the first surface region of the surface of the lasted upper which will be processed by a subsequently generated tool path.

As another measure representing the first surface region of the surface of the lasted upper which will be processed by a subsequently generated tool path, at least part of the surface of the lasted upper may be scanned to generate profile data representing at least the first surface region in three dimensions. For example, a light source may be projected across at least a portion of the first surface region of the surface of the lasted upper after the lasted upper has been removed from the corresponding bottom unit representation. At least one camera may detect the reflection of the light from the surface of the lasted upper from at least a portion of the first surface region. Data representing the bite line may then be combined with the three dimensional upper surface data and used to include, exclude or otherwise regard or disregard data representing the surface of the lasted upper that is inside or outside of the first surface region, as appropriate, in generating a tool path. For example, the intersection of the projected light and indicia corresponding to the bite line provided on the lasted upper may be detected by the at-least one camera detecting the reflection of the laser from the surface of the lasted upper. Alternatively/additionally, a virtual bite line may be compared to the three-dimensional profile data generated from detecting the reflection of the laser from the surface of the lasted upper, with data for locations on the surface of the lasted upper outside of the first surface region as defined by the virtual bite line data excluded or otherwise disregarded in generating a tool path. In detecting the reflected light from the surface of the lasted upper, at least one camera may be used. The use of more than one camera may provide increasingly detailed data regarding the three-dimensional surface of the lasted upper. In some examples, two cameras may be used to detect the reflected light from the surface of the lasted upper.

Systems and methods in accordance herewith may utilize a computing system executing computer-readable code to generate data representing the surface of the lasted upper from the three-dimensional profile data provided by at least one camera detecting the light reflected from the surface of the first surface region and/or the virtual bite line data. The same or a different computing system may execute computer executable code to perform a method to generate a tool path based upon a combination of the bite line data representing the bounds of the first surface region and the three-dimensional data representing the surface of the lasted upper within the first surface region. Different types of tools performing different types of processing on different types of shoes made of different types of materials may require different tool paths. In some examples, the tool may comprise a spray nozzle that applies a spray adhesive to the lasted upper for the ultimate bonding of the upper to the corresponding bottom unit. In such an example, the tool path may maintain the tool head at a desired distance and/or orientation relative to the surface of the lasted upper. For example, a tool path may maintain the spray nozzle at an orientation that will project adhesive onto the surface at a substantially perpendicular angle, such as between 80 and 100 degrees, and at a relatively constant distance, such as within one-half centimeter to two centimeters. In further examples, the distance may be maintained as approximately one centimeter, with a 10% variation permitted. The orientation relative to the surface, distance from the surface, and/or other properties of the tool path may be varied at different portions of the tool path, if desired.

Different types of tool paths may be required for different types of shoe parts, different shoes, different materials, etc. In the example of using a spray-on adhesive to bond a lasted shoe upper to a corresponding bottom unit, a tool path may provide processing to the perimeter of the first surface region to establish a strong bond near the edges of the bottom unit with less coverage provided within the interior of the first surface region, where bonding is less critical. However, systems and methods hereof are not limited to any particular type of tool, type of tool path, or particular tool path.

BRIEF DESCRIPTION OF THE DRAWINGS

The present invention is described in detail herein with reference to the attached drawing figures, wherein.

DETAILED DESCRIPTION

Aspects hereof provide systems and methods for processing shoe parts and generating tool paths for processing parts in the shoe manufacturing process. In examples described herein, the tool paths generated are used in the bonding of a shoe upper to a shoe sole assembly or bottom unit. However, aspects hereof may be used for generating other types of tool paths and for the processing of other portions of an article of footwear. For example, aspects hereof may be useful for generating tool paths to buff, clean, prime, paint, or otherwise process surfaces in the manufacturing process of soft goods such as shoes.

While the examples of shoe uppers and shoe bottom units are presented in a simplified fashion for exemplary purposes herein, in practice a shoe upper may comprise a large number of individual parts, often formed from different types of materials. The components of a shoe upper may be joined together using a variety of adhesives, stitches, and other types of joining components. A shoe bottom unit may often comprise a shoe sole assembly with multiple components. For example, a shoe bottom unit may comprise an outsole made of a relatively hard and durable material, such as rubber, that contacts the ground, floor, or other surface. A shoe bottom unit may further comprise a midsole formed from a material that provides cushioning and absorbs force during normal wear and/or athletic training or performance. Examples of materials often used in midsoles are, for example, ethylene vinyl acetate foams, polyurethane foams, and the like. Shoe soles may further have additional components, such as additional cushioning components (such as springs, air bags, and the like), functional components (such as motion control elements to address pronation or supination), protective elements (such as resilient plates to prevent damage to the foot from hazards on the floor or ground), and the like. While these and other components that may be present in a shoe upper and/or a shoe bottom unit are not specifically described in examples herein, such components may be present in articles of footwear manufactured using systems and methods in accordance with aspects hereof.

Figure 1:
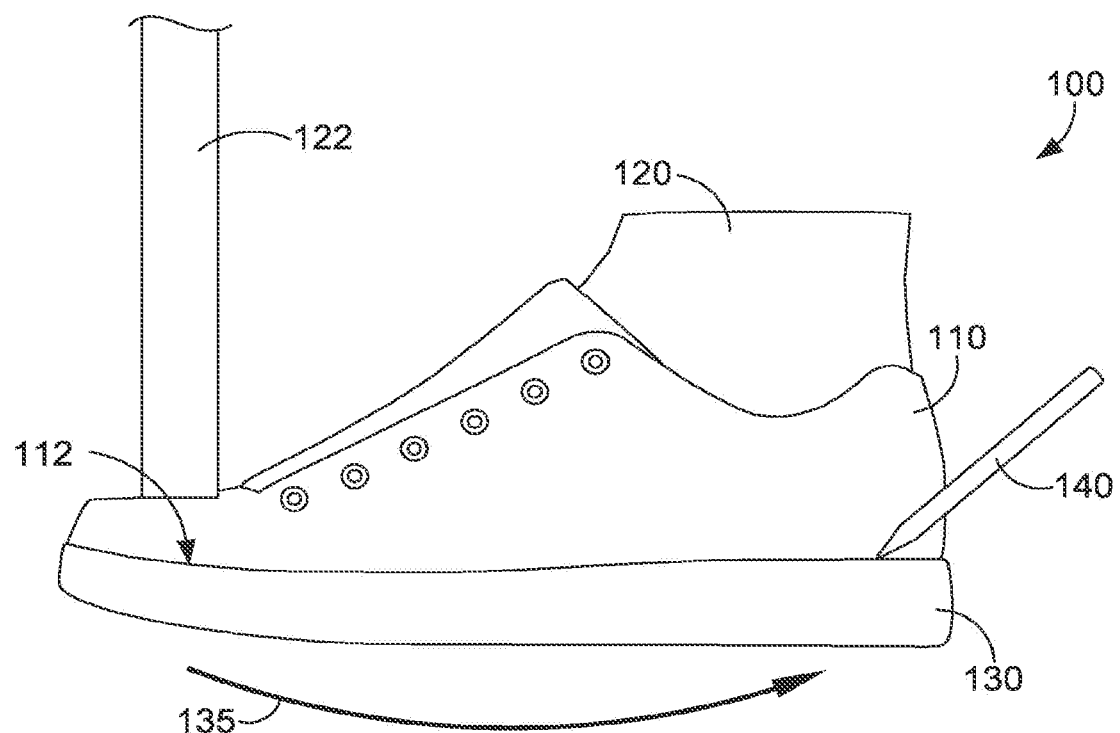
FIG. 1 is a schematic diagram illustrating an example of a lasted shoe upper and corresponding bottom unit in accordance with an aspect hereof.

Referring now to FIG. 1, an exemplary system in accordance with aspects hereof is illustrated and designated generally as reference numeral 100. In the illustrated system 100, a shoe upper 110 has been placed on a last 120. The last 120 may apply a predetermined amount of force, optionally in conjunction with an additional member 122 to retain the lasted upper 110 against a corresponding bottom unit or a representation 130 of a corresponding bottom unit. It should be noted that, in processing, a representation 130 of a corresponding unit often may be utilized rather than the bottom unit itself so that a single bottom unit representation 130 may be utilized to process a plurality of shoe uppers. A bottom unit representation 130 may emulate the actual materials, size, shape, contours, etc. of the corresponding bottom unit that will be applied to the shoe upper 110 upon assembly of the shoe. Further, it is contemplated that the bottom unit representation 130 may be formed from a material different from that which is typically used for the bottom unit. For example, a more durable and rigid material may form at least a portion of the bottom unit representation as the function of the bottom unit representation 130 is to provide a guide for applying a bite line marking in a repeated production process. This is in contrast to a functional purpose of the actual bottom unit, which is generally provided for impact attenuation, support, and traction, among other reasons.

In the example illustrated in FIG. 1, the bottom unit representation 130 and the lasted upper 110 may be rotated as indicated by arrow 135 while contacted by a marking mechanism 140 having a marking tip at a junction 112 between the lasted upper 110 and the bottom unit representation 130. In the illustrated example, the marking mechanism 140 may comprise a marking mechanism that utilizes a conditionally visible marking agent applicable via the marking tip to apply conditionally visible indicia on the lasted upper 110 at the junction between lasted upper 110 and bottom unit representation 130. More particularly, the marking mechanism 140 may comprise a marking mechanism with one of a fluorescent marking tip and an IR marking tip that applies fluorescent indicia or IR indicia, respectively, at the junction 112 between the lasted upper 110 and the bottom unit representation 130 to create a conditionally visible bite line observable only under lighting conditions permitting the conditionally visible indicia to be detected.

Because the lasted upper 110 and/or corresponding bottom unit representation 130 may often be formed from pliable and/or compressible materials, the location of a bite line on the surface of the lasted upper 110 may vary based upon the amount of force or pressure used to mate the lasted upper 110 with the corresponding bottom unit representation 130. The predetermined amount of force applied by the system 100 during the marking of a conditionally visible bite line using the marking mechanism 140 may be the same force applied when ultimately bonding the lasted upper 110 to the bottom unit represented by the bottom unit representation 130, but may be different than the force applied during bonding without departing from the scope hereof. For example, if the bottom unit representation 130 is formed from a material different than the intended bottom unit, the amount of force to be applied may be adjusted to compensate for a different amount of compressibility between the materials. Further, it is contemplated that the size of the bottom unit representation 130 may actually be varied from that of the bottom unit to be applied as the size may compensate for variances in compressibility, deformability, or even the thickness of the tip 142.

Figure 2:
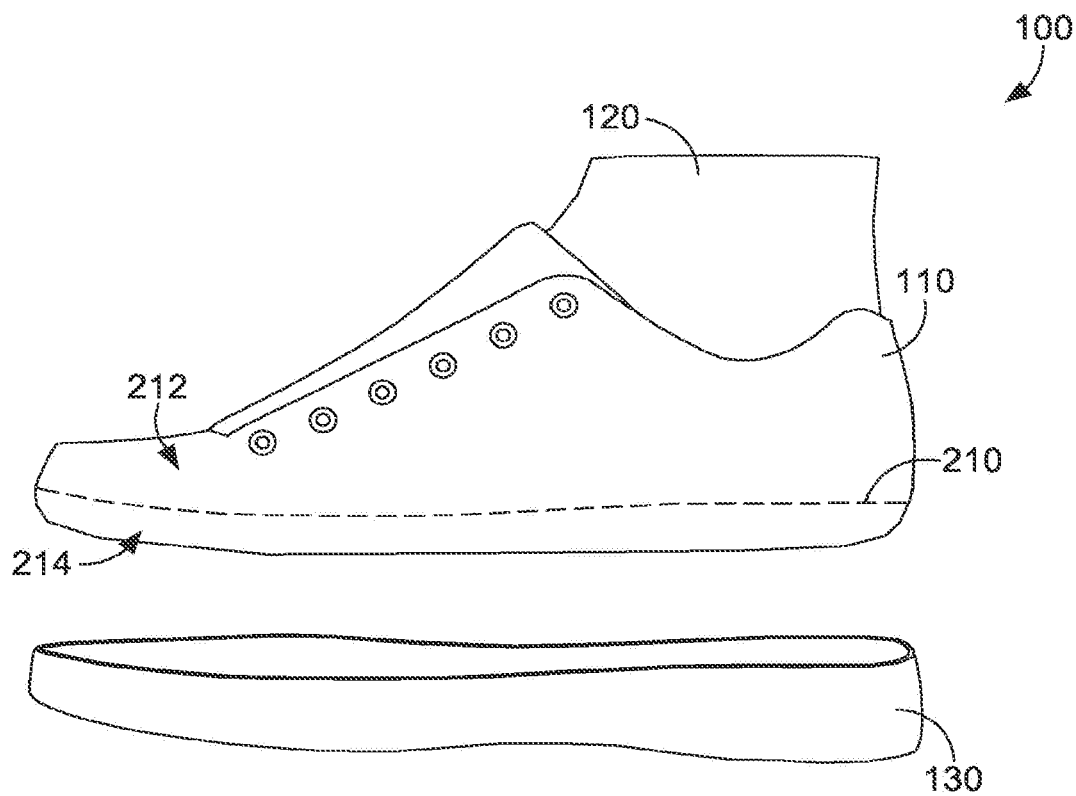
FIG. 2 is a schematic diagram illustrating an example of a bite line on a lasted shoe upper in accordance with an aspect hereof.

Referring now to FIG. 2, the lasted upper 110 has been removed from the corresponding bottom unit representation 130. As shown in FIG. 2, a conditionally visible bite line 210 has been marked on the lasted upper 110. The conditionally visible bite line 210 may not be perceivable during all lighting conditions, the lighting conditions under which the conditionally visible bite line 210 is perceivable depending upon the marking agent used to mark the bite line 210. For example, the conditionally visible bite line 210 may only be visible when illuminated by a UV light source (e.g., a black light), an IR light source, or another lighting source that causes the marking agent used to apply the indicia of the conditionally visible bite line 210 to be detectable. In one example, the conditionally visible bite line 210 may comprise an indicia formed from a fluorescent marking agent (e.g., ink) such that the conditionally visible bite line 210 may be perceived when illuminated using a black light. In another example, the conditionally visible bite line 210 may comprise an indicia formed from an IR marking agent such that the conditionally visible bite line 210 may be perceived when illuminated using an IR light source. Any and all such variations, and any combination thereof, are contemplated to be within the scope of aspects hereof.

Still referring to FIG. 2, the conditionally visible bite line 210 defines a first surface region 214 and a second surface region 212 on the surface of the lasted shoe upper 110. The first surface region 214 corresponds to the portion of the surface of the lasted upper 110 that was covered by the bottom unit representation 130 when the lasted upper 110 was retained against the corresponding bottom unit representation 130 with a predetermined amount of force. Meanwhile, the second surface region 212 corresponds to the portion of the surface of the lasted upper 110 that was not covered by the corresponding bottom unit representation 130 when the lasted upper 110 was pressed against the corresponding bottom unit representation 130 with the predetermined amount of force. Accordingly, any processing intended to bond the bottom unit represented by the bottom unit representation 130 to the lasted upper 110 should be performed within the first surface region 214 bounded by the conditionally visible bite line 210. Further, any processing that may change the appearance of the surface of the lasted upper 110 that is performed in the second surface region 212 may result in changes observable in the finished shoe, while processing performed within the first surface region 214 may not be ultimately observable after the shoe has been assembled by bonding the lasted upper 110 to the corresponding bottom unit represented by the bottom unit representation 130.

The example of FIG. 2 illustrates only one example of the location of a conditionally visible bite line 210 on the surface of a shoe upper 110. The orientation, position, and configuration of a conditionally visible bite line in accordance with the present invention may vary greatly from that shown in the example of FIG. 2. For some shoe designs, the bottom unit represented by the bottom unit representation 130 may mate with the upper 110 in a fashion that extends the bottom unit 130 over a greater portion of the upper 110, resulting in a conditionally visible bite line 210 located further from the bottom of the upper 110 (e.g., closer to a forefoot opening and/or an ankle opening). For other shoe designs, the entirety of the bottom unit represented by the bottom unit representation 130 may be largely or entirely below the upper 110, resulting in a conditionally visible bite line 210 that is entirely or largely on the bottom surface of the upper 110 (e.g., proximate a strobel board in a strobel construction technique). In other examples, the extent to which a bottom unit represented by the bottom unit representation 130 extends up an upper 110 when mated may vary along the junction of the upper 110 and bottom unit representation 130, resulting in a conditionally visible bite line 210 that is not parallel with the bottom of the upper 110. Further it is contemplated that the conditionally visible bite line 210 may extend farther from the bottom unit in certain areas, such as a toe region and/or a heel region. In this example, the bottom unit may cover a greater portion of the upper 110 in these areas to provide structural benefits, such as abrasion resistance or improved ground-contacting surface (e.g., traction).

The shape of the upper 110 at the junction between the upper 110 and the bottom unit representation 130 may also vary from that shown in the example of FIG. 2, meaning that the conditionally visible bite line 210 may be created on a portion of the shoe upper 110 that is flat, convex, concave, or possessing a complex three dimensional curvature. Systems and methods in accordance herewith may provide and utilize conditionally visible bite lines in all of these and other configurations of a shoe upper and/or bottom unit.

Figure 3:
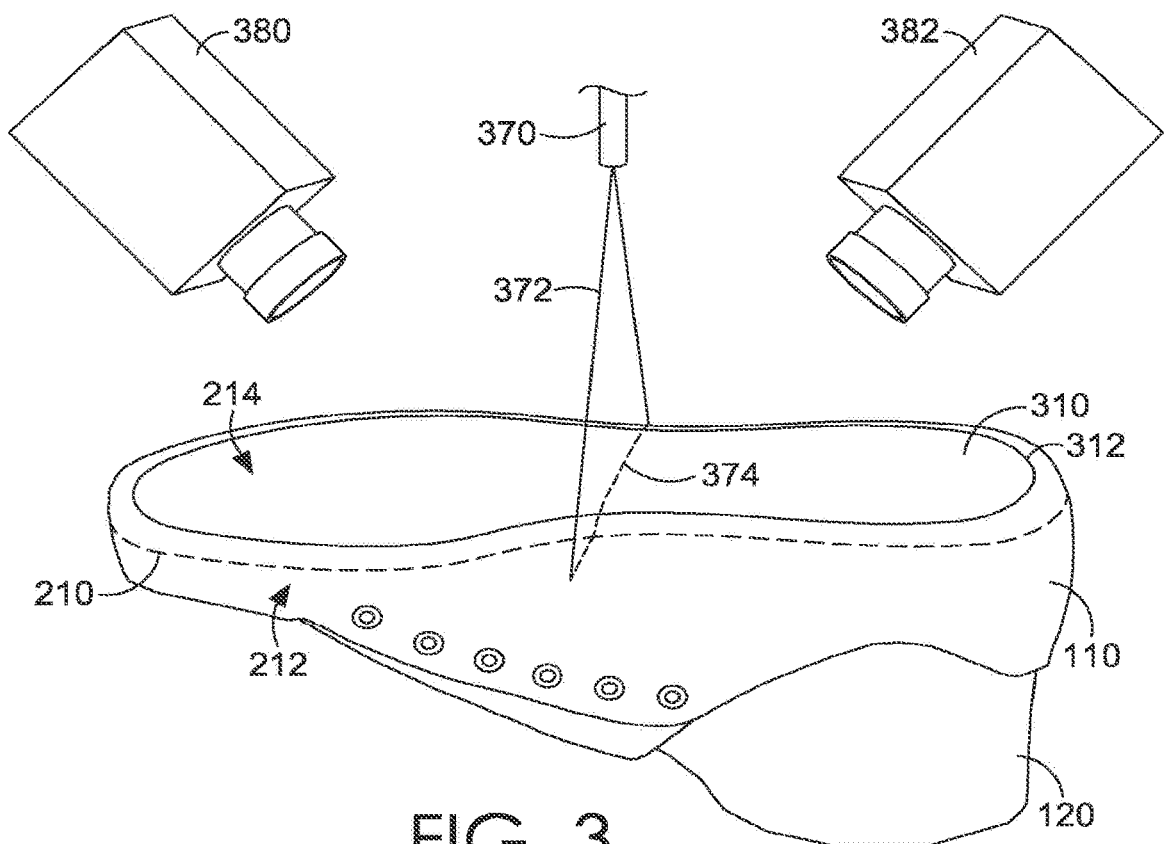
FIG. 3 is a schematic diagram illustrating an example of scanning of the surface of a lasted shoe upper in accordance with an aspect hereof.

Referring now to FIG. 3, illustrating an exemplary three-dimensional surface scan having a light source 370 that may project a light 372 such that a reflected portion 374 reflects across a segment of at least the first surface region 214 of the surface of the lasted upper 110 and the second surface region 212. In the example depicted in FIG. 3, a strobel 310 has been joined to the upper 110 by a stitch 312 to enclose and contain the last 120. In the example illustrated, the strobel 310 is contained within the first surface region 214 of the lasted shoe upper 110 and, therefore, will ultimately be covered after shoe assembly. In some examples, the lasted upper 110 may use closure structures different than strobel 310, but in many athletic shoes some type of strobel, such as the strobel 310, are used to enclose the upper 110 to permit the insertion of the last 120 to appropriately expand the upper 110 over the last 120.

Still referring to FIG. 3, at least one camera 380 (illustrated as a first camera 380 and a second camera 382 in FIG. 3) may detect the portion 374 of the light 372 that reflects from one or more surfaces, such as a surface of the strobel 310 and a portion of the first surface region 214 extending between the strobel 310 and the bite line 210, of the lasted upper 110. In the example of FIG. 3, a second camera 382 has been provided that also detects the light from the portion 374 of the light 372 that reflects from the surface of the lasted upper 110. The use of more than one camera may provide a greater field of view such that if a portion of a surface to be captured is obscured from a first camera having a first perspective and location, a second camera having a different perspective and location may be effective for capturing the portion of surface obscured from the view of the first camera. As such, additional cameras may be utilized to supplement image data captured from a first camera when the first camera is not conveniently located to capture all portions of a surface desired to be captured. It is also contemplated, as illustrated, that the reflected portion 374 extends beyond the bite line 210 such that the reflected portion may be effective for generating a surface map for portions of the lasted upper 110 beyond the conditionally visible bite line 210 into the second surface region 212, in an exemplary aspect.

Figure 14:
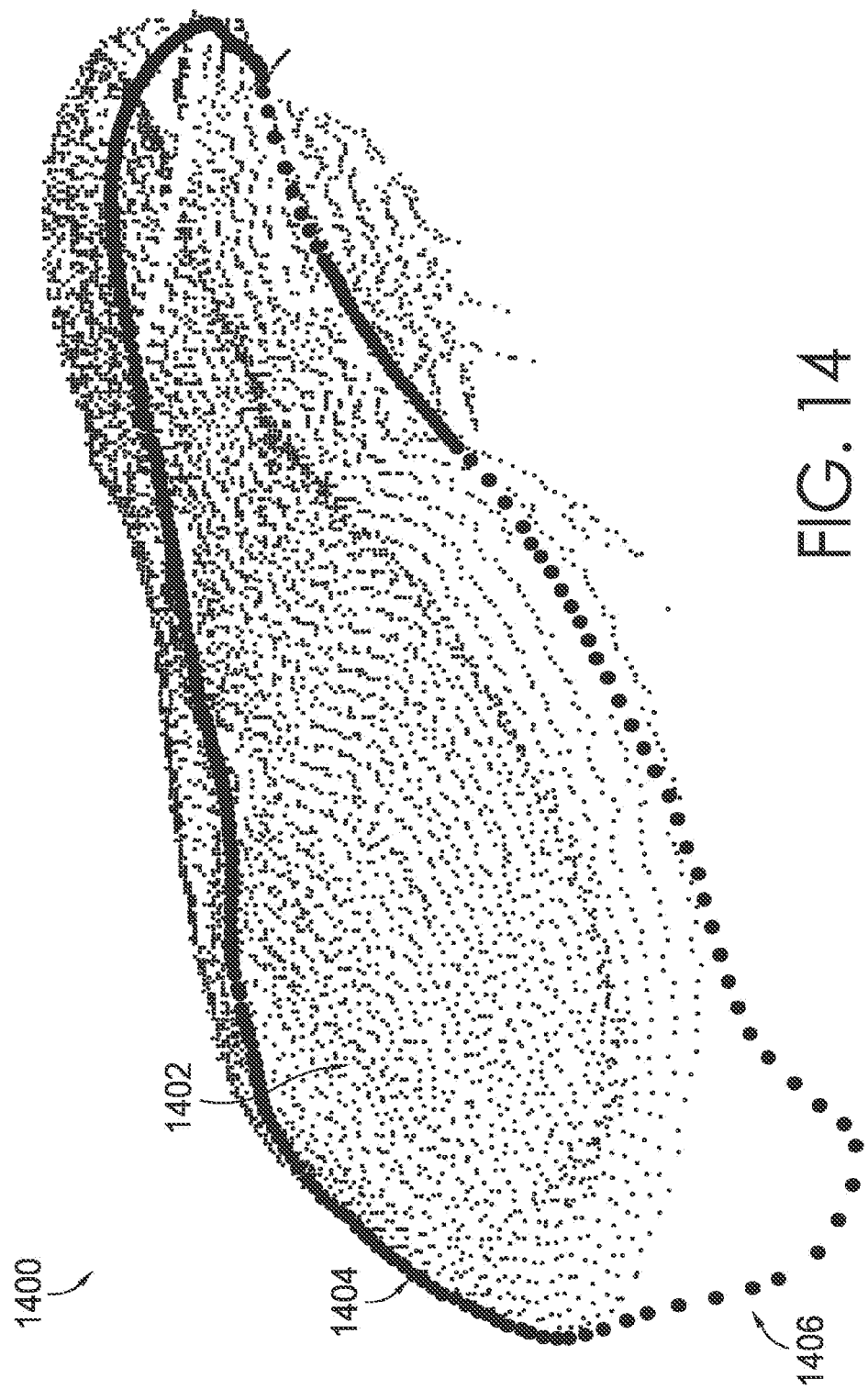
FIG. 14 is a depiction of a three-dimensional point cloud representation of a surface mapping of a lasted upper surface combined with a three-dimensional digital bite line representation, in accordance with aspects hereof.

In aspects, each of the first camera 380 and the second camera 382 may be utilized to detect the reflection of light from the surface of the lasted upper to develop a point cloud of the external surface(s). A point cloud is a collection of points in a coordinate system, such as a three-dimensional coordinate system represented by X, Y, and Z coordinates (also referred to as x y z coordinates herein), that represents points as identified on an external surface of the lasted upper. FIG. 14 hereinafter will depict an exemplary point cloud representing a surface of a lasted upper in addition to a three-dimensional representation of a bite line as coordinated with the point cloud coordinates. In order to generate the point cloud representing the external surfaces, images from both the first camera 380 and the second camera 382 may be combined, utilizing a computing system (not shown), to generate the point cloud as a three-dimensional surface map of the lasted upper. The three-dimensional surface map may be combined and coordinated with bite line data, such as the digital bite line representation, generate a tool path for further processing of the shoe, as more fully described below. As will also be discussed herein, it is contemplated that the surface scan system generating the three-dimensional surface scan and the digital bite line detection system generating the digital bite line may be calibrated using one or more known techniques, such as a multi-planar visual calibration tool. The calibration, in an exemplary aspect, allows for the computing system to accurately merge the digital bite line data with the three-dimensional surface scan data to form a representation of the lasted upper for purpose of generating a tool path. While two cameras are described in this example for generating the three-dimensional surface map as a point cloud, it is contemplated that a single imaging source in combination with one or more structured lights may produce a useable three-dimensional surface mapping in an alternative aspect.

The light source 370 and/or the at least one camera 380, 382 may comprise components of any surface imaging system that generates a digital representation, often utilizing computer software, based upon reflections 374 of the light 372 detected by the at least one camera 380, 382. It is contemplated that the at least one camera 380, 382 may be comprised of one or more filters, such as longpass, shortpass, or bandpass filters to selectively capture specific or ranges of light energy to further refine the process. For example, it is contemplated that the light source 370 and the at least one camera 380, 382 may be adapted to leverage a specific band of wavelength, such as infrared and special filters receptive to infrared wavelengths. Other surface imaging systems, such as systems utilizing cameras without a light source or contact systems that use one or more probes to physically engage a surface, may alternatively be used with systems and/or methods in accordance herewith.

The light source 370 may be any suitable light source that provides a defined geometrical representation at a distance from the upper 110. For example, a slit lamp that produces a focused slit-like beam of light from an otherwise unstructured light source may produce the projected light needed to specifically identify an intersection between the light and the conditionally visible bite line 210. Another light source option includes a structured laser light source. A structured laser light source is a laser that projects a laser light in a structured light pattern, such as a line. This structured line of light may be formed by allowing light in a specific plane to fan outwardly from the source while constraining the dispersion of light in all other directions to result in a plane of light emanating from the structured laser source. When the plane of light contacts a surface, a laser line representation is formed having a focused nature and a controlled width perpendicular to the plane the light forms.

Light source 370 may comprise a laser line generator (e.g., laser micro line generator or laser macro line generator) having various features and capabilities. Exemplary features comprise an adjustable fan angle; homogenous intensity distribution; constant line width (i.e., thickness throughout whole measuring area); adjustable width; adjustable spectral range (e.g., 635 nm-980 nm); and adjustable power (e.g., up to 100 mW in the visible range and up to 105 mW in the IR range). In one aspect, light source 370 may have a fan angle of 40 degrees, a line length of 180 mm, a line width (i.e., thickness) of 0.108 mm, a working distance of 245 mm, a Rayleigh Range of 12 mm, a focusing range of 205-510 mm, and a convergence of 0.7 degrees, for example.

Various aspects of light source 370 may be adjusted in coordination with shoe-part characteristics. For example, a color of laser beam may be set or adjusted based on a color of a shoe part. That is, certain combinations of laser-beam color (e.g., wave length) and shoe-part color may allow the projected laser line 374 to be better recorded using at least one camera 380, 382. As such, the laser-beam color may be adjusted accordingly based on a shoe-part color.

Moreover, power levels of light source 370 may be adjusted based on a color of the shoe part. For example, a single laser may have an adjustable power setting, such that the single laser may be adjusted based on shoe-part color. In another example, multiple lasers that have different power levels may be interchangeably utilized based on a color of the shoe part. In a further example, multiple lasers may be arranged at a single station. In one aspect of the invention, a high-power laser may be utilized when projecting a beam onto a shoe part that is colored black (or is non-white). In a further aspect of the invention, a low-power laser may be utilized when projecting a beam onto a shoe part that is colored white. In a further aspect, multiple lasers may be used at the same time when a part is multi-colored. For example, both a high-power laser and a low-power laser may project respective beams onto a shoe part that is colored black and white. The at least one camera 380, 382 is positioned to record an image of projected laser line 374. As such, the captured image depicts a representation of the projected laser line as it appears reflected across a portion of the lasted upper 110.

While the figures and discussion herein describe the data set representations as being a visual indication of the data, such as an actual point cloud surface map for the three-dimensional surface map or a three-dimensional line representing the digital bite line, it is understood that the data representation may not be visually depicted. For example, the data representations may merely be a mathematical expression, mathematical model, a series of coordinates, or other non-visual representations of the data that are not necessarily graphically depicted by a computing device or other means of manifesting a perceivable depiction of the data representations. However, for convenience, a visual depiction of the different data representations are depicted and described herein.

Figure 4:
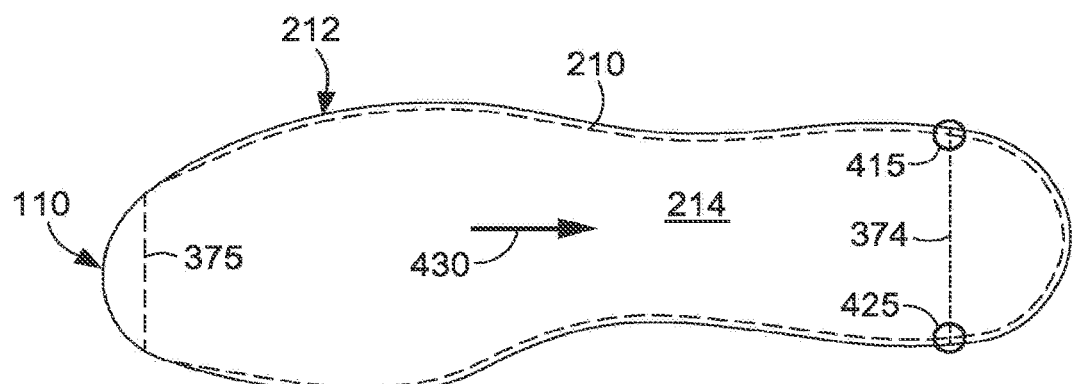
FIG. 4 is a top elevation view illustrating a further example of scanning the surface of a lasted shoe upper in accordance with an aspect hereof.

Referring now to FIG. 4, one example of the scanning of at least the first surface region 214 of a lasted upper 110 using light 372 from a structured light source (e.g., a laser) is illustrated. A reflected portion 374 of the projected light 372 is reflected by the surface of the lasted upper 110 in at least the first surface region 214 and a portion of the second surface region 212. In order to generate the three-dimensional profile data to be utilized in conjunction with the bite line data to generate a tool path to process the lasted upper 110 for bonding to a corresponding bottom unit by, for example, applying and adhesive to the lasted upper 110, only portions of the surface of the upper 110 that are substantially within the first surface region 214 should be profiled, but the collected data should adequately cover the first surface region 214. Accordingly, systems and methods in accordance herewith may generate a tool path based upon the bite line data and the three-dimensional profile data (e.g., three-dimensional surface map, point cloud) of the surface of the first surface region 214. It is contemplated that surface data for the second surface region 212 may also be captured and may be useable in calibrating, in an exemplary aspect, the data provided by the digital bite line and the three-dimensional surface map. In this example, the surface data for the second surface region 212 may not be utilized in the generation of the tool path, in an exemplary aspect.

Still referencing FIG. 4, the lasted upper 110 may be moved relative to the projected light 372, or the alternative is also contemplated such that the projected light 372 may be moved relative to the lasted upper 110, such that at least the substantial entirety of at least the first surface region 214 of the lasted upper 110 is scanned. It is contemplated that the intersection of the reflected portion 374 of the light 372 and the bite line 210 may be detected along at least a portion of the bite line 210, which may be used to coordinate three-dimensional surface map data with bite line data, in an exemplary aspect. However, contours of the upper 110 may render portions of the bite line 210, and thus portions of the intersection of the bite line 210 with the projected light 372, not visible to the at least one camera 380, 382. In such instances, the bite line data may be utilized to supplement the three-dimensional profile data to extrapolate the appropriate tool path, as more fully described below and illustrated in connection with FIG. 16 hereafter.

As shown in FIG. 4, the portion 374 of the light 372 reflected from the surface of the lasted upper 110 may intersect the bite line 210 at a first point 415 and a second point 425. The segment defined by the first point 415 and the second point 425 of the portion 374 of light 372 reflected from the surface of the lasted upper 110 corresponds to a segment of the surface within the first surface region 214. It is contemplated that the length and position of such segments may be determined by a computing system after combining data obtained from the three-dimensional surface map (or based on data from the three-dimensional surface map alone) and the digital bite line to help determine a tool path. By recording three-dimensional cloud points within at least a plurality of such segments as the lasted upper 110 moves relative to the light 372 as indicated by line 430, a representation of substantially the entire surface within the first surface region 214 may be generated. However, as will be discussed hereinafter, it is contemplated that portions of the second surface region may also be captured as part of the surface scan. It is contemplated that the lasted upper 110 may move relative to a stationary light source 370, that the light source 370 may move relative to the lasted upper, or that both the lasted upper 110 and the light source 370 both move relative to each other to accomplish one or more of the scan discussed herein. Of course, whether the lasted upper 110 or the light source 370 is moved may vary for different examples hereof.

Also depicted in FIG. 4 is an alternative portion 375 of reflected light 372. Unlike the portion 374 that is positioned at a location at which the portion 374 intersects the bite line 210, the portion 375 is not perceived by a camera to intersect the bite line 210. The bite line 210 may extend on a portion of the lasted upper that is obscured from the three-dimensional surface scan components, as will be discussed in FIG. 16. This lack of intersection highlights an exemplary aspect for which the combination of digital bite line data and the three-dimensional surface map data is used to generate a tool path. For example, without supplementing the three-dimensional scan data proximate the location of the portion 375, a resulting tool path may not be able to identify a bite line position for which the tool path is to be bounded. Further, it is contemplated that the components utilized in capturing the three-dimensional surface map may be ineffective (e.g., ineffective lighting parameters) for identifying a conditional bite line regardless if it is at the portion 374 where an intersection is able to be perceived or if it is at portion 374 where an intersection is not able to be perceived with the bite line 210. Therefore, when the components utilized to capture the three-dimensional surface map data are not effective at capturing the conditionally visible bite line, a combination of the digital bite line data with the three-dimensional surface map data is needed to generate a tool path within determined tolerances.

Figure 5:
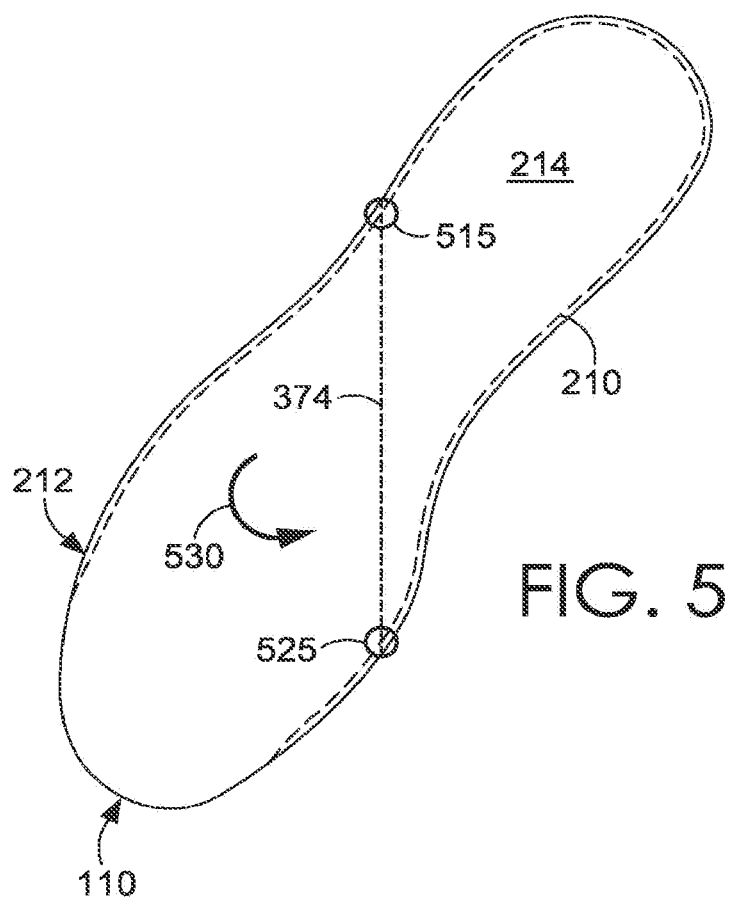
FIG. 5 is a top elevation view illustrating a further example of scanning the surface of a lasted shoe upper in accordance with an aspect hereof.

Referring now to FIG. 5, another example of using a light source that projects a light to scan at least the surface of the first surface region 214 of the lasted upper 110 is illustrated. While the example of FIG. 4 moves the lasted upper 110 relative to the light 372 in a linear fashion as indicated by arrow 430, in the example of FIG. 5, the lasted upper 110 may be rotated as indicated by arrow 530 relative to the light 372. Accordingly, the at-least one camera may detect the reflected portion 374 of the light from the surface of the lasted upper 110 as the lasted upper 110 and/or the light source are rotated 530 relative to one another. The intersection of the reflected portion 374 of the light and the bite line 210 may be determined/detected, in an exemplary aspect; however, it is optional as a separate bite line scan may be utilized to achieve a comprehensive identification of the conditionally visible bite line location. In the example illustrated in FIG. 5, a segment extending between a first intersection point 515 and a second intersection point 525 may represent a small portion of the surface of the first surface region 214. By rotating the lasted upper 110 relative to the light source 370, a plurality of such segments may be obtained to provide a more complete representation of the surface region 214 in three dimensions using one or more cameras 380, 382.

As discussed with respect to FIG. 4, it is contemplated that one or more portions of the bite line 210 may be obscured from the three-dimensional surface mapping components, which illustrates a further need, in an exemplary aspect, for a separate bite line data collection. Further, as also contemplated above, the components used to capture the three-dimensional surface map data may not be adapted to capture a conditionally visible bite line, in an exemplary aspect.

Figure 6A:
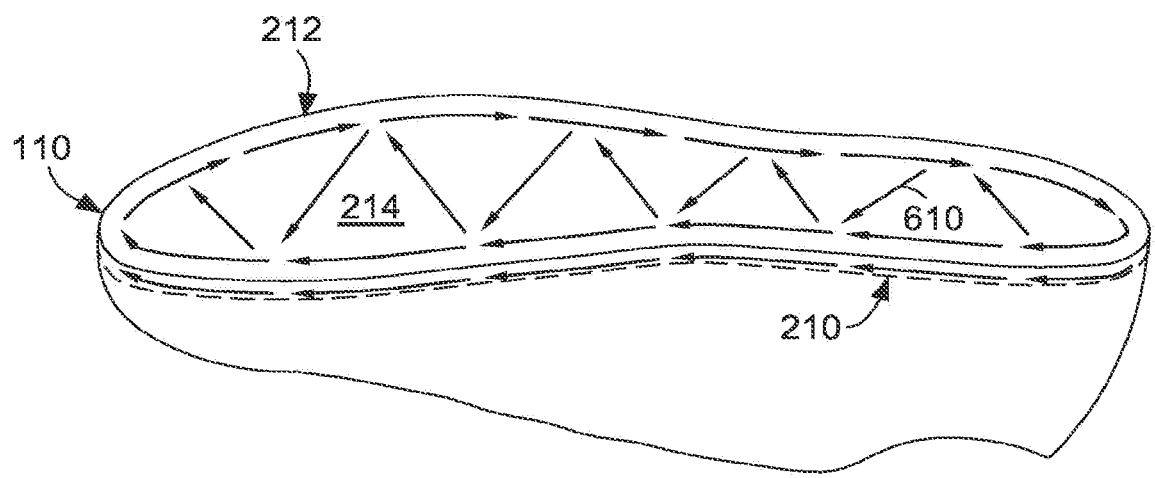
FIG. 6A illustrates an example of a tool path generated for processing the surface of a lasted shoe upper in accordance with an aspect hereof.

Referring now to FIG. 6A, a tool path 610 may be generated to process the surface of the lasted upper 110 within the first surface region 214 bounded by the bite line 210 of the upper 110. In the example illustrated in FIG. 6A, the tool path 610 comprises a plurality of segments that process the perimeter of the first surface region 214 while remaining within the interior of the bite line 210 and then processes at least portions of the interior of the first surface region 214. The tool path 610 may further represent the orientation of a tool in three-dimensional space relative to the surface of the first surface region 214, for example, to maintain a spray nozzle, buffer, brush, or other tool at a particular angle relative to the surface of the first surface region 214. While a particular tool path 610 is depicted in FIG. 6A, it is contemplated that alternative tool paths may be implemented to achieve a similarly bounded coverage area.

The tool path 610 may also include information describing additional degrees of movement and control, such as nozzle angle, nozzle distance, flow rate, and the like. For example, a tool path 610 may further maintain a spray nozzle at a substantially perpendicular angle to the surface of the first surface region 214, such as between 80 and 100 degrees. Further, the tool path 610 may comprise a relatively constant distance or a varying distance from the surface of the lasted upper 110 within the first surface region 214. For example, a brush, buffer, or other type of tool that physically contacts the surface of the lasted upper 110 may have its position in three-dimensional space vary to maintain the tool and contact with the surface of the lasted upper 110 within the first surface region 214. Other types of tools, however, such as spray nozzles, may have an optimal distance or range of distances from the surface of the lasted upper 110. Accordingly, a tool path 610 may maintain such a tool at a particular distance, such as 1.0 centimeter, or at a variety of distances based upon the degree of coverage desired, such as between 0.5 and 2.0 centimeters, for different parts of a tool path 610. For example, if a spray nozzle is to be moved along the tool path 610, the tool path 610 may maintain the spray nozzle at a first distance along the bite line 210 but at a second distance greater than the first distance within the interior of the first surface region 214. In such an example, the spray of adhesive may be more precisely controlled at the shorter first distance to prevent overspray while the spray may provide less dense but more extensive coverage at the second greater distance. Numerous variations and different types of tool paths beyond the example tool path 610 illustrated in FIG. 6A may be utilized without departing from the scope of aspects hereof.

Figure 6B:
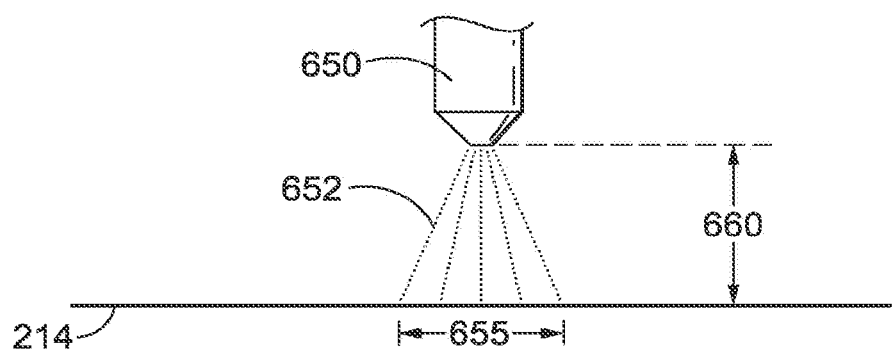
FIGS. 6B-6D illustrate examples of a tool portion having varied orientation and position arrangement for a generated tool path in accordance with aspects hereof.
Figure 6C:
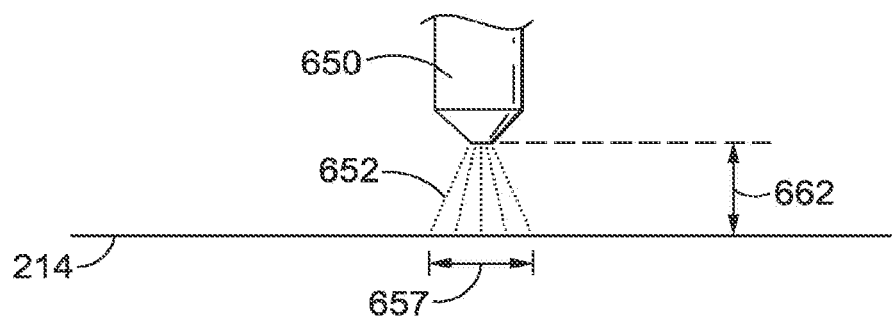
Figure 6D:
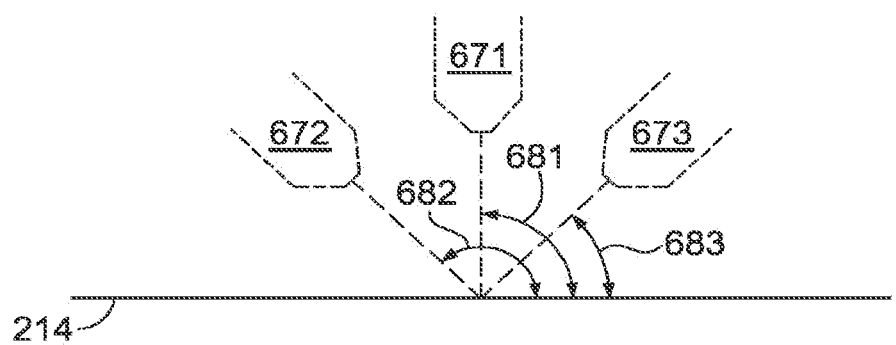

FIGS. 6B-6D illustrate further examples of parameters that may be part of a tool path generated in accordance with aspects hereof. For example, a tool may be a spray nozzle 650 that sprays an adhesive 652 onto the surface of the first surface region 214 of a lasted shoe upper. A tool path may maintain a tool such as spray nozzle 650 at a distance and/or angle relative to the surface of a surface region 214 to be treated. In the example of FIG. 6B, the nozzle 650 has a first distance 660 which produces a first coverage surface region 655 for the sprayed adhesive 652. In the further example of FIG. 6C, the nozzle 650 has a second distance 662 that is shorter than the first distance 660 and that correspondingly produces a second coverage surface region 657 smaller than the first coverage surface region 655. Of course, a tool such as the nozzle 650 may be positioned at a variety of distances beyond the first distance 660 and the second distance 662 described in the present example. Further, a tool such as a nozzle 650 may be placed at positions and/or orientations with various angles relative to the surface of the surface region 214 to be treated. For example, as shown in FIG. 6D, a nozzle may be placed in a first orientation 671 at a first angle 681 perpendicular to the surface of the surface region 214 to be treated, at a second orientation 672 at a second angle 682 (obtuse in this example) relative to the surface of the surface region 214 to be treated, or at a third orientation 673 at a third angle 683 (acute in this example) relative to the surface of the surface region 214 to be treated.

Figure 7:
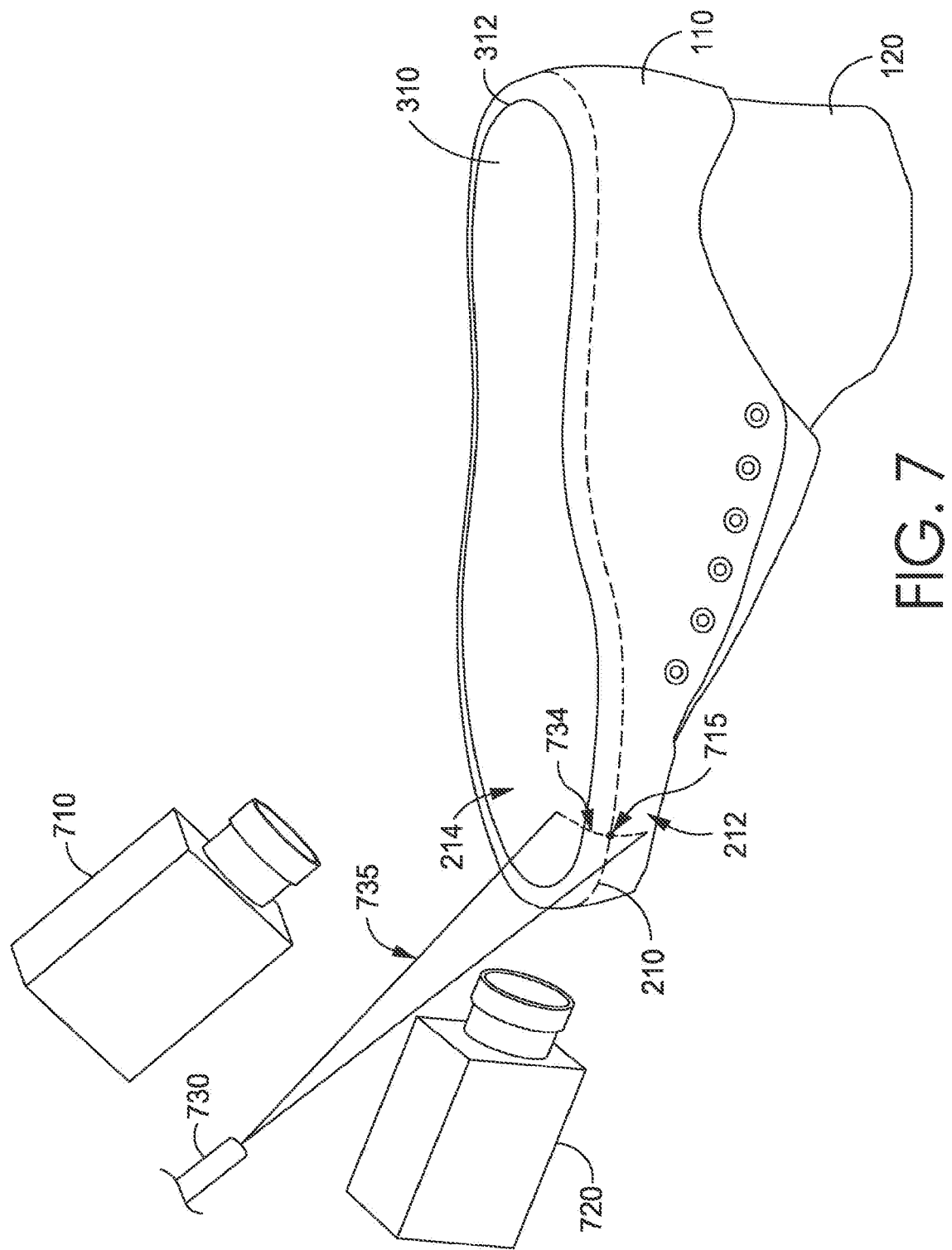
FIG. 7 illustrates an example of the creation of a virtual bite line on a lasted shoe upper in accordance with an aspect hereof.

Referring now to FIG. 7, an example of the generation of a virtual bite line is illustrated. Additional disclosure directed to the capture of a digital bite line is provided in a concurrently filed application titled "Conditionally visible bite lines for footwear," having U.S. application Ser. No. 14/084,359, and now issued as U.S. Pat. No. 9,237,780, the entirety of which is hereby incorporated by reference. A lasted upper 110 may be retained with a predetermined amount of force against a representation 130 of a corresponding bottom unit. A light source 730 (such as a laser) may project a structured light 735 at the bite line demarcated on the lasted upper 110. It is contemplated that the demarcated bite line may be formed with a conditionally visible marking agent, such as an IR or UV responsive ink. As previously provided, the use of a conditionally visible agent for demarcating the bite line may prevent aesthetically distracting remnants of a demarcated bite line from being visible on a final shoe. Further, to prevent having the demarcated bite line from being visible, an attempt may traditionally have been made to remove visible portions of the demarcated bite line, which may require additional resource that would not be needed when using a conditionally visible bite line.

A first light source 730 (e.g., a laser) projects light 735 such that a portion 734 of the light 735 projects across at least a portion of the surface of the marked lasted upper 110. More particularly, at least a portion 734 of light 735 from the light source 730 may reflect from at least a portion of the first surface region 214 and the second surface region 212 of the surface of the marked lasted upper 110. The light source 730 may be any suitable light source that provides a defined geometrical representation at a distance from the upper 110, such as a structured light like a laser.

In aspects hereof, the wavelength of the light 735 emitted from the light source 730 renders the conditionally visible bite line 210 detectable. For instance, if the conditionally visible bite line 210 is marked utilizing an IR marking agent and the light source 730 is an IR light source emitting light 735 in the IR spectrum, the light 735 from the light source 730 will render the conditionally visible bite line 210 detectable at the intersection(s) of the light 735 and the bite line 210, obviating the need for any additional source of light, as illustrated in current FIG. 7. In other aspects, however, the wavelength of the light 735 emitted from the light source 730 does not render the conditionally visible bite line 210 detectable. For instance, if the conditionally visible bite line 210 is marked utilizing a fluorescent marking agent and the light 375 emitted from the light source 730 is not in the UV spectrum, the conditionally visible bite line 210 will not be detectable. In such aspects, an additional lighting source may be needed to render the conditionally visible bite line 210 detectable, such as a supplemental UV lamp. It is contemplated that any number of optional light sources may be implemented that provide any wavelength of light.

While the light 735 from the light source 730 is projected across at least a portion of the lasted upper 110 to intersect with the bite line 210 while the bite line 210 is rendered observable by the at least one light source, at least one camera may capture an image of the lasted upper 110 and, more particularly, an intersection 715 between the reflected portion 734 of light 735 and the conditionally visible bite line 210. As illustrated in FIG. 7, the at least one camera comprises a first camera 710 and a second camera 720, and optionally may comprise additional cameras (not shown), to capture the intersection 715 of the bite line 210 and the reflected portion 734 of the projected light 735. The use of at least a first camera 710 and a second camera 720 may assist in accurately locating the intersection 715 of the bite line 210 and the reflected portion 734 of the projected light 735. For example, it is contemplated that the at least one camera 710, 720 is comprised of two cameras to leverage the benefits of stereopsis that allows a computing system to determine depth information from a pair of concurrently captured images from varied perspectives. The leveraging of two or more cameras from offset locations allows a computing system to determine x y z coordinates for a given point, such as the intersection 715.

As more fully described below, the intersection of the reflected light 734 and the bite line 210 may be used to create a virtual bite line (i.e., a digital bite line) that aids in identifying the portion of the surface of the lasted upper 110 within the first surface region 214 that includes a bottom portion 310 of the lasted upper 110 that is to be treated, for instance, by cementing, priming, cleaning, paining, buffing, and the like. For example, it is contemplated that one or more components of the bite line scanning system may rotate around the perimeter of the lasted upper to capture data about the perimeter of the lasted upper. Alternatively, it is contemplated that the lasted upper is moved or rotated about the bite line scanning system to achieve a capture of data about a perimeter of the lasted upper.

Figure 8:
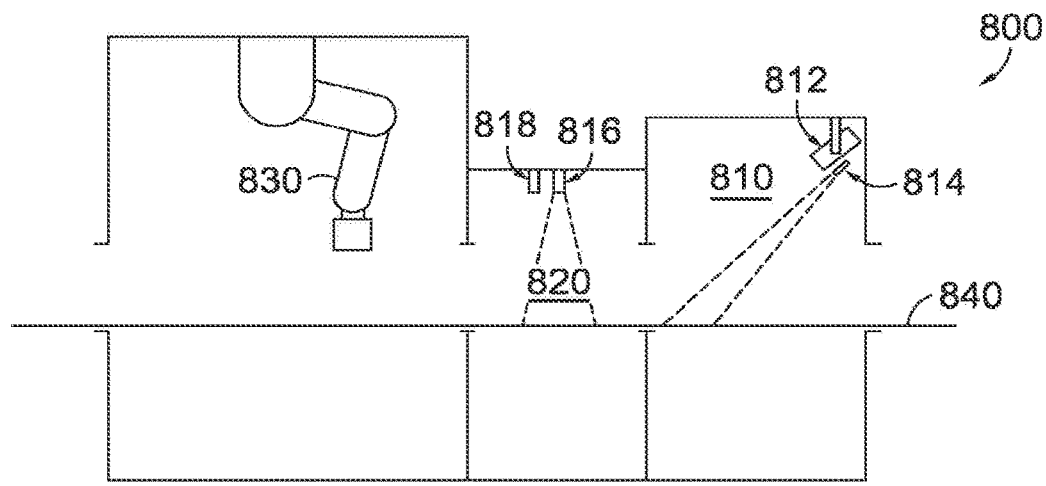
FIG. 8 is a schematic diagram illustrating an exemplary system for generating a tool path in accordance with an aspect hereof.

Referring now to FIG. 8, a system for generating a tool path in accordance with an aspect hereof is illustrated and designated generally as reference numeral 800. The system 800 includes a bite line component 810, a three-dimensional scanning component 820 and a tool 830 for processing a shoe part being processed. The bite line component 810 facilitates the collection of bite line data on a shoe upper, the bite line data representing an interface between the shoe upper and a corresponding bottom unit upon assembly of the shoe. Various methods for marking a bite line and generating bite line data have been discussed herein. For instance, bite line data may be generating utilizing a digital stylus system to trace the bite line on a shoe upper temporarily joined to a representation of a corresponding bottom unit as described in co-pending U.S. patent application Ser. No. 13/647,511, entitled "Digital Bite Line Creation for Shoe Assembly," which is hereby incorporated by reference in its entirety. Alternatively, bite line data may be generated by marking the bite line with physical indicia and scanning the shoe upper to determine the intersection points of the indicia and a light source, as described hereinabove with respect to FIG. 7. In aspects hereof, physical indicia may be marked with conditionally visible marking agents, for instance, fluorescent or infrared marking agents, rendering the resulting bite line indicia detectable only under specific lighting conditions. In such aspects, the bite line component 810 may include at least one light source 814 for scanning and/or rendering the bite line indicia detectable, and at least one camera 812, which may represent multiple cameras, for taking images of the points of intersection of light from the at least one light source and the conditionally visible indicia demarcating the bite line. In particular aspects, a first camera and a second camera are utilized to record images of the intersection points, the images from the two cameras being combined to generate the bite line data.

The three-dimensional scanning component 820 of the system 800 of FIG. 8 facilitates the collection of three-dimensional profile data for at least a portion of the shoe upper to be covered by the corresponding bottom unit upon assembly of the shoe. Various methods for collecting three-dimensional profile data have been described herein. In particular aspects, at least one light source 816 and at least one camera 818 scan the surface of the shoe upper covering at least a portion of the surface region bounded by the bite line. Due to contours of the surface of the shoe upper, portions of the bite line, and thus portions of the shoe upper bounded by the bite line, may not be visible to at least one camera imaging the shoe upper or the at least one camera is not adapted to detect the bite line. Accordingly, in accordance with aspects hereof, the bite line data collected at the bite line component 810 is combined with the three-dimensional profile data collected at the three-dimensional scanning component 820 in a computing system (not shown), to generate a tool path for further processing by the tool 830. As previously set forth, the tool may be a variety of tools designed to clean, buff, adhere, cement, etc. during processing of the shoe.

The configuration shown in FIG. 8 of the system 800 for processing a shoe part is merely an example of a configuration the system 800 may take. Movement from one component of the system to another in FIG. 8 is via a conveyor belt 840. However, the order of the components, particularly the bite line component 810 and the three-dimensional scanning component 820, as well as the conveyance mechanism may vary within the scope of aspects hereof. For instance, the shoe parts may be conveyed from component to component utilizing one or more robots instead of or in addition to a conveyance belt.

Additionally, while not explicitly depicted, it is contemplated that one or more of the components of the bite line component 810, the three-dimensional scanning component 820, and/or the tool 830 may move to operate in multiple degrees of freedom. For example, as provided herein, it is contemplated that the components of the bite line component 810 may move in a motion path about a shoe part. The motion path may be elliptical in nature such that at least one foci of the elliptical pattern is positioned proximate a portion of the shoe upper. Additionally or alternatively, it is contemplated that the shoe part itself may be moved, such as rotated, relative to one or more components of the bite line component 810. Therefore, it is contemplated that components of the digital bite line component 810, such as the at least one camera 812 and the at least one light 814 may be moveably mounted or fixedly mounted within the digital bite line component 810, in an exemplary aspect. Similarly, the at least one light source 816 and at least one camera 818 may be moveably mounted or fixedly mounted within the three-dimensional scanning component 820 to achieve a desired surface scan.

Figure 9:
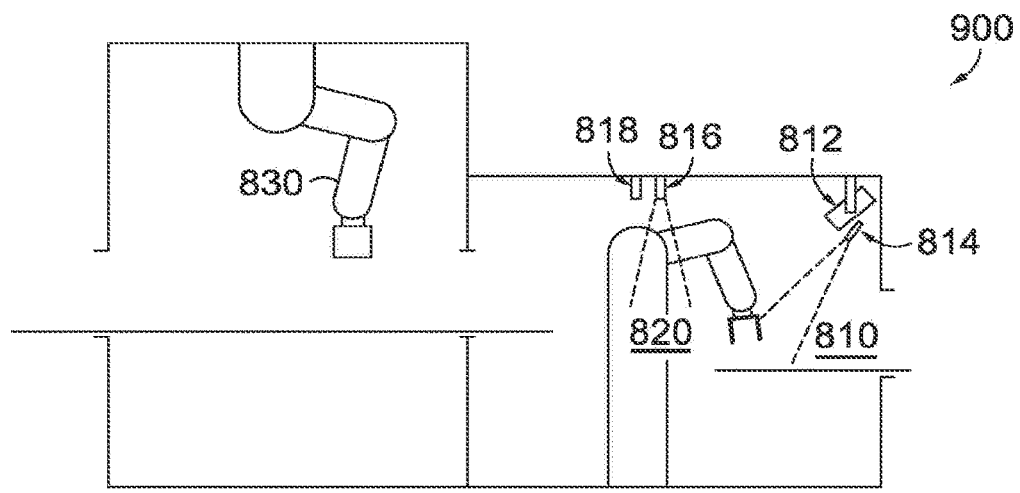
FIG. 9 is a schematic diagram illustrating another exemplary system for generating a tool path in accordance with an aspect hereof.
Figure 10:
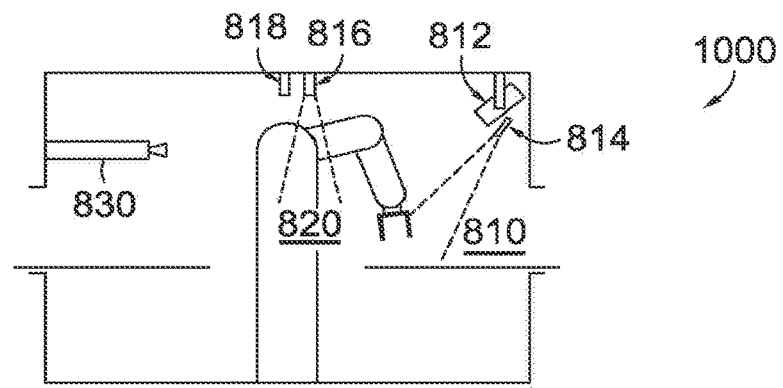
FIG. 10 is a schematic diagram illustrating another exemplary system for generating a tool path in accordance with an aspect hereof.

FIGS. 9 and 10 illustrate alternate system configurations that fall within the scope of aspects hereof. For example, a system 900 of FIG. 9 relies on a multi-axes robotic arm as a conveyance mechanism between the bite line component 810 and the three-dimensional scanning component 820.

The tool 830 in FIG. 9 continues to be a multi-axial moving tool. In this example of FIG. 9, it is contemplated that the multi-axis robotic arm servicing both the bite line component 810 and the three-dimensional scanning component 820 provides the degrees of movement desired to manipulate the shoe part about the various components of the bite line component 810 and the three-dimensional scanning component 820 to achieve a sufficient bite line identification and surface scan, in an exemplary aspect. For example, the at least one camera 812 and light source 814 may be fixedly mounted within the bite line component 810 such that the robotic arm moves the shoe part in multiple dimensions to capture the bite line representation about the perimeter of the shoe part.

A system 1000 of FIG. 10 relies on a common multi-axes robotic arm for conveyance from the bite line component 810, the three-dimensional scanning component 820, and the tool 830. In this example, the tool 830 is relatively static and processing by the tool relies on the movement offered by the multi-axes robotic arm. Therefore, it is contemplated that a variety of conveyance mechanism and tooling options may be leveraged to accomplish aspects of the present invention. Similar to FIG. 9, it is contemplated that the robotic arm provides the degree of movement necessary for each component to achieve an intended result, such as identification of a bite line and generation of a surface map. Therefore, the components of the bite line component 810, the three-dimensional scanning component 820, and the tool 830 may be fixedly coupled and the shoe is moved sufficiently about the components to achieve the results intended by the system, in an exemplary aspect.

Figure 11:
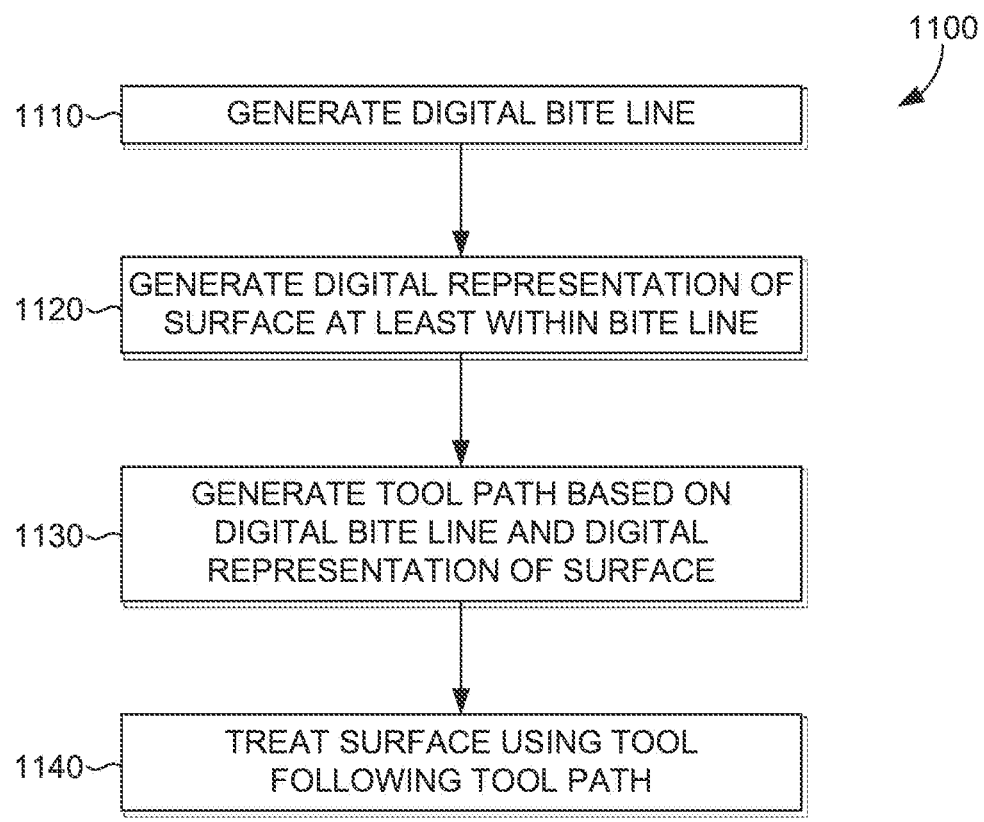
FIG. 11 is a flow diagram illustrating an exemplary method for treating a surface of an article of footwear in accordance with aspects hereof.

Referring now to FIG. 11, a method 1100 for generating a tool path is illustrated. In step 1110 bite line data may be collected. Bite line data collected in step 1110 may represent a virtual bite line generated using a stylus, a light source (e.g., a laser) and cameras, or any other methodology. In some examples, step 1110 may be performed by using design data, pattern data, or typical data measured when a lasted shoe upper is retained against a corresponding bottom unit (or representation thereof) to create a digital bite line without applying a lasted upper to a bottom unit, for example as shown in FIG. 1, but step 1110 may also be performed individually for each part or set of parts to be processed.

In step 1120 three-dimensional profile data representing at least a portion of the surface of a shoe upper bounded by the bite line may be collected. For example, a light source and at least one camera may be used to generate a three-dimensional data representation, such as a point cloud, of at least a portion of the surface of a lasted upper bounded by the bite line. Alternatively, a camera alone, a contact probe, or other mechanism may be used to generate a digital representation of the surface. Portions of the surface not bounded by the bite line created in step 1110 may be disregarded, in exemplary aspects, in generating the representation of the surface at least within the bite line. It is contemplated that the step 1120 may precede the step 1110 in an exemplary aspect as the order of collecting the bite line data and the surface scan data may be varied. Further, in an exemplary aspect, it is contemplated that the bite line data and the surface data may be obtained in a common operation by different or common components, in an exemplary aspect.

In step 1130, the bite line data and the three-dimensional profile data may be combined to generate a tool path for further processing of the shoe upper, which may be generated based upon the combined data. The tool path generated in step 1130 may assure that the surface is not processed outside of the digital bite line and may further maintain a tool at a desired distance, orientation, or other status relative to the surface. The tool path generated in step 1130 may vary at different locations along the path and within the surface region defined as bounded by the bite line. The tool path may include instructions for a robotic element to position a tool proximate various surface portions of the lasted upper, such as a bottom surface and portions of a side wall portion, in an exemplary aspect. In step 1140 the surface may be treated following the tool path. For example, step 1140 may comprise buffing the surface, spraying an adhesive onto the surface using a nozzle, etc.

In order to accomplish aspects, such as the method provided in FIG. 11, it is contemplated that a system for processing partially assembled parts of an article of footwear includes a marking mechanism for marking physical indicia on a shoe upper at a bite line. The indicia may be marked with a conditionally visible marking agent, in an exemplary aspect. The system may then leverage a light source that projects light across at least a portion of the marked bite line at an angle non-parallel to the marked bite line. In order to capture the intersection of the light and the indicia, a first camera that records a first series of images representing a plurality of points at which the light intersects with the marked bite line and representing the reflection of the light off of the at least part of the portion of the shoe upper to be covered by the corresponding bottom unit upon assembly of the shoe may be used. Further, to achieve depth information through stereopsis, it is contemplated that a second camera that records a second series of images representing the plurality of points at which the light intersects with the marked bite line may also be used. In this example, it is the use of two cameras that provides the dimensional coordinates necessary to develop a three-dimensional representation of the bite line. However, it is contemplated that variations in a known structured light as captured by a camera may also be used to determine the coordinates necessary for developing a three dimensional representation, such as a point cloud of the lasted upper surface. Further, a computing system that processes the first and second series of images to generate bite line data may be integrated therein. The computing system may also use additional images or the first and second series of images to further develop a three-dimensional profile data for the shoe portion. Further, the computing system may take bite line data and the three-dimensional profile data to generate a tool path for processing, such as an application of adhesive.

Figure 12:
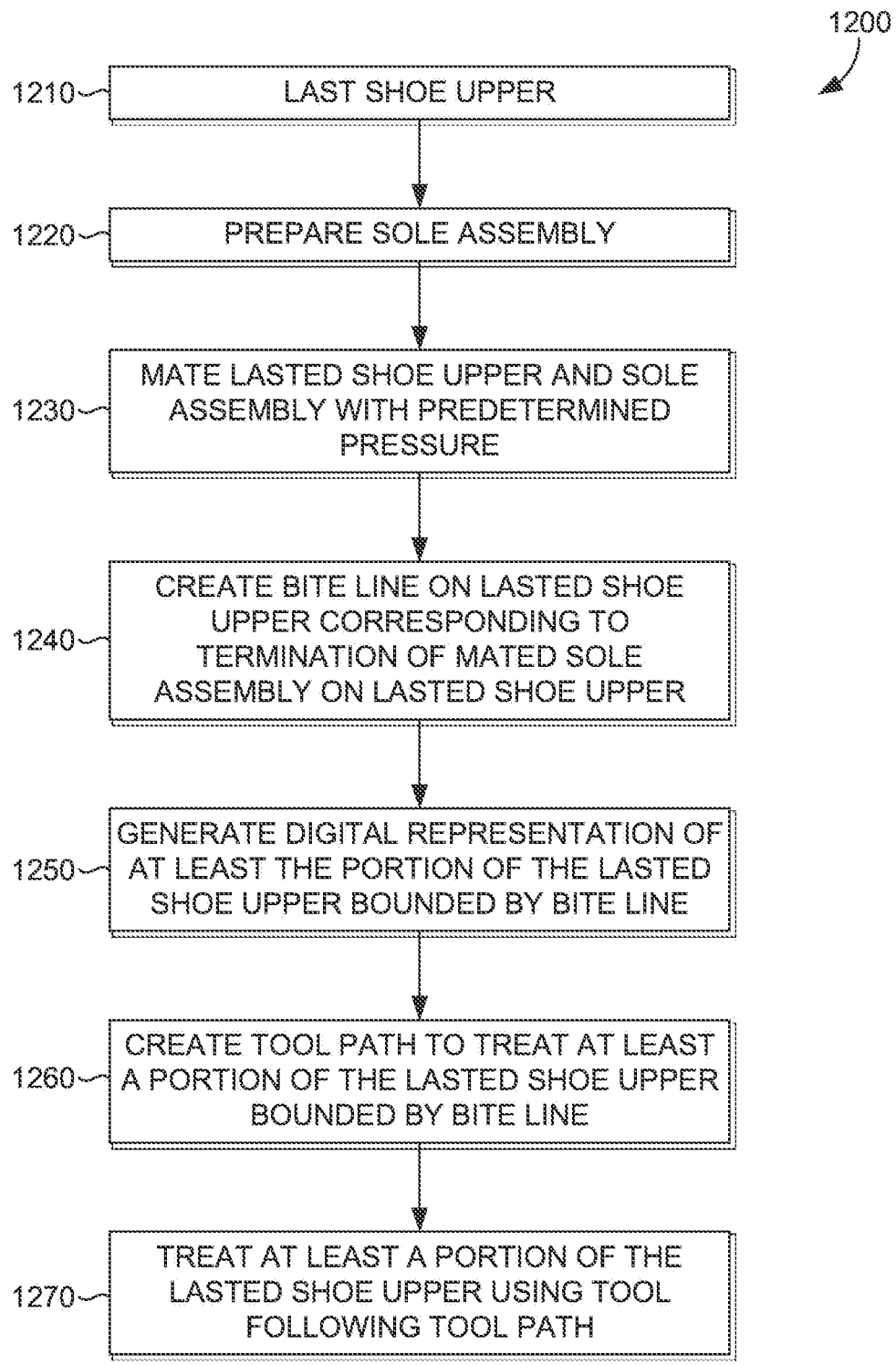
FIG. 12 is a flow diagram illustrating another exemplary method an exemplary method for treating a surface of an article of footwear in accordance with aspects hereof.

Referring now to FIG. 12, a further example of a method 1200 for processing a shoe upper in accordance with the present invention is illustrated. In step 1210 a shoe upper may be lasted. As previously discussed, the lasting of a shoe upper may include positioning a form within an internal cavity of the upper to provide structure and shaping. In step 1220 a sole assembly, such as a sole or a representation of a sole, may be prepared. Preparation may include positioning the sole assembly for eventual mating to the lasted upper. Step 1210 and/or step 1220 may combine multiple components to form an upper and/or a bottom unit. In step 1230 the lasted shoe upper and the corresponding sole assembly may be mated with a predetermined pressure/force to result in a junction between the sole assembly and the lasted upper. In step 1240 a bite line may be marked on the surface of the lasted shoe upper that corresponds to the termination of the mated sole assembly on the lasted shoe upper. This location of termination is a junction between the sole assembly and the lasted upper forming a guide to place the bite line. Step

1240 may utilize a stylus, a light source (e.g., a laser) and one or more cameras, or any other system or process to mark indicia comprising a bite line or a virtual bite line, which are used to create a digital bite line representing coordinates on the lasted upper at the junction between the sole assembly and the lasted upper.

In step 1250 three-dimensional profile data representing at least the portion of the lasted shoe upper bounded by the bite line (and additional portions in exemplary aspects) may be generated and collected. The generated digital representation may be formed from any type of input, such as a three-dimensional and/or a digital bite line scan. For example, the surface region bounded by the bite line on the lasted shoe upper may comprise a first surface region, and that first surface region may be scanned using a laser and at least one camera or other surface scanning techniques, some of which are described in examples herein. In step 1260, the bite line data and the three-dimensional profile data may be leveraged within a computing system to generate a tool path to treat at least a portion of the lasted shoe upper that is bounded by the bite line.

The tool path may be generated by software based on computer-aided design (CAD) and computer-aided manufacturing (CAM) concepts that take data from the three-dimensional profile data and the digital bite line data to determine appropriate aspects of the tool path (e.g., location, speed, angle, flow, etc.). For example, it is contemplated that the software is provided information with respect to constraints associated with a desired process (e.g., application of adhesive). The constraints may include a desired coverage, applicator information, cycle time constraints, and other variable that are used in determining an appropriate tool path. The software then may take these inputs in combination with the three-dimensional profile data and the digital bite line data to develop an appropriate tool path that satisfies the provided constraints while staying within the desired area bounded by the digital bite line data, in an exemplary aspect. Finally, in step 1270 at least a portion of the lasted shoe upper may be treated using a tool following the tool path generated in step 1260, such as a multi-axis robot having an adhesive-applying tool head attached thereto. For example, constraints associated with the particular tool to be used may be provided to the software along with constraints associated with the multi-axis robot such that the resulting tool path is specific to the particular shoe upper to be processed, the tool doing the processing, and the robot controlling and moving the tool, in an exemplary aspect.

Figure 13:
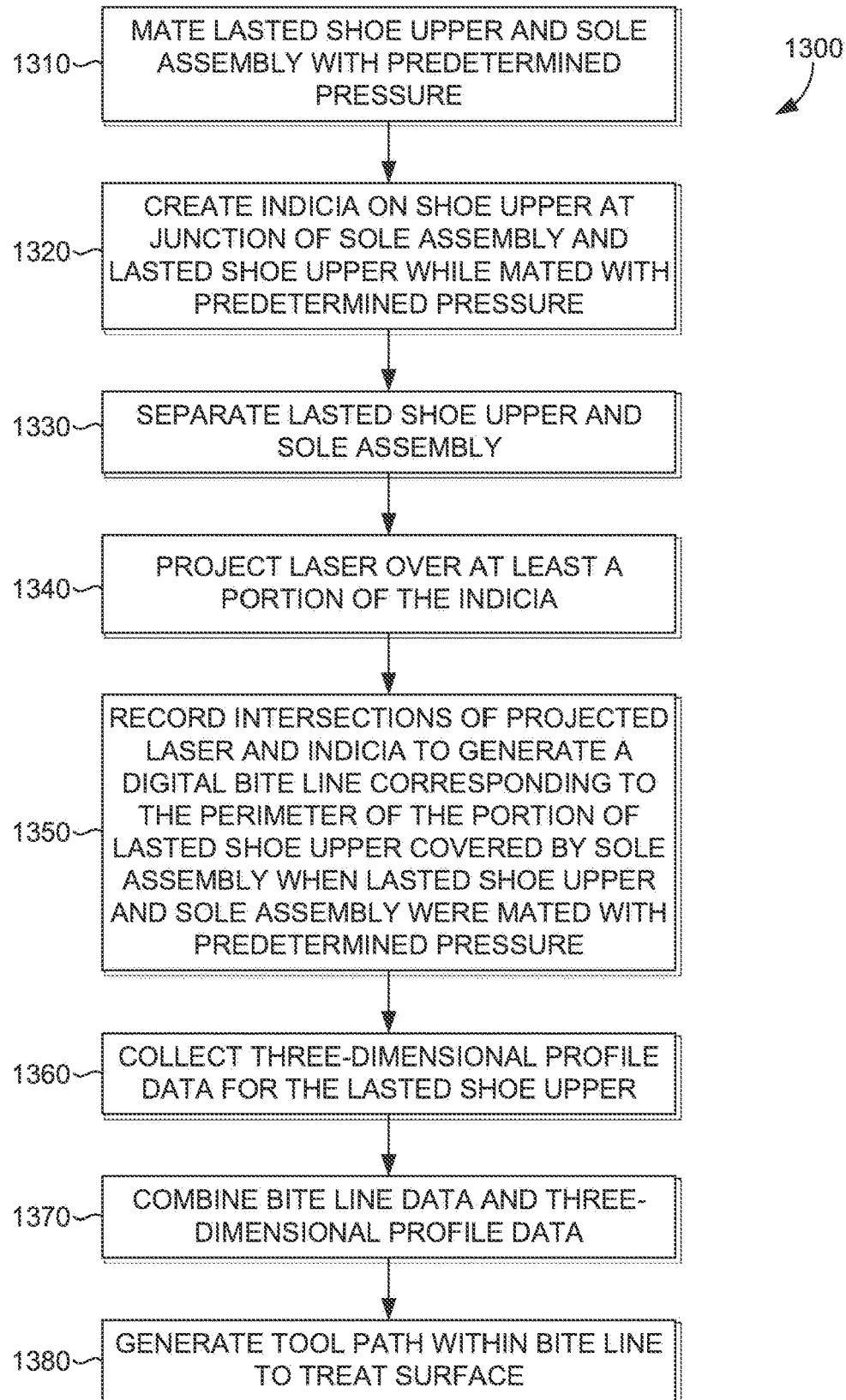
FIG. 13 is a flow diagram illustrating an exemplary method for generating a tool path in accordance with aspects hereof.

Referring now to FIG. 13, a further exemplary method 1300 of generating a tool path for processing a shoe upper in accordance with aspects hereof is illustrated. In step 1310 a lasted shoe upper may be retained against a corresponding bottom unit (or representation thereof) by mating a lasted shoe upper and bottom unit with a predetermined amount of pressure. In step 1320 a bite line may be marked on the shoe upper by creating indicia on the shoe upper. For example, step 1320 may apply a mark to the shoe upper at the junction of the bottom unit (or representation thereof) and the lasted shoe upper while mated with a predetermined amount of pressure. While a predetermined amount of pressure is discussed, the amount of pressure may be a general amount sufficient to temporarily mate the bottom unit (e.g., sole assembly) with the lasted upper. In one aspect, the amount of pressure applied may be approximately 30 kg/cm or more, for example. Step 1320 may use an ink, a pencil, or a fluorescent, IR, or other conditionally visible material, or any other way of forming perceptible indicia on the shoe upper. In step 1330 the lasted shoe upper and the sole assembly may be separated. Step 1330 may permit the subsequent scanning and treatment of the surface region of the lasted shoe upper that was covered by the bottom unit (or representation thereof) when the bite line was created in step 1320.

In step 1340 a light source (e.g., a laser) may be projected over at least a portion of a bite line identifier, such as a conditionally visible bite line demarcation or indicia. Step 1340 may be performed using lighting conditions that render a conditionally visible bite line, such as a bite line using fluorescent or IR marking agent, observable using one or more cameras if a limited/conditionally visibility bite line was created in step 1320. In step 1350 the intersections of the projected laser and the bite line may be recorded to generate bite line data that represents the perimeter of the portion of the lasted shoe upper for which a tool path will be generated to correspond to the portion of the lasted shoe upper covered by the bottom unit (or representation thereof) when the lasted shoe upper and bottom unit (or representation thereof) were mated with the predetermined amount of pressure.

In step 1360 three-dimensional profile data for the lasted shoe upper may be collected (as more fully described above) and, in step 1370, the bite line data and the three-dimensional profile data may be combined. In step 1380 a tool path may be generated within the bite line to treat the surface of the lasted shoe upper.

FIG. 14 is a depiction of a combined representation 1400 of a three-dimensional surface map (e.g., point cloud) representation 1402 of a lasted upper surface combined with a three-dimensional digital bite line representation 1404. The three-dimensional surface map representation 1402 is depicted as a dot pattern to represent identified points, such as cloud points. The three-dimensional digital bite line representation 1404 is depicted as larger circular indicia. As illustrated in this exemplary aspect, the three-dimensional digital bite line representation 1404 proximate a toe region 1406 extends beyond the data represented by the three-dimensional surface map representation 1402. As such, the combination of the two representations to form a tool path is beneficial in at least this portion of the lasted upper as a single representation alone may not provide sufficient information. For example, a portion of the lasted upper may obscure a portion of surface to be scanned based on the relative positioning of the components and the lasted upper, as will be illustrated in FIG. 16.

Figure 15:
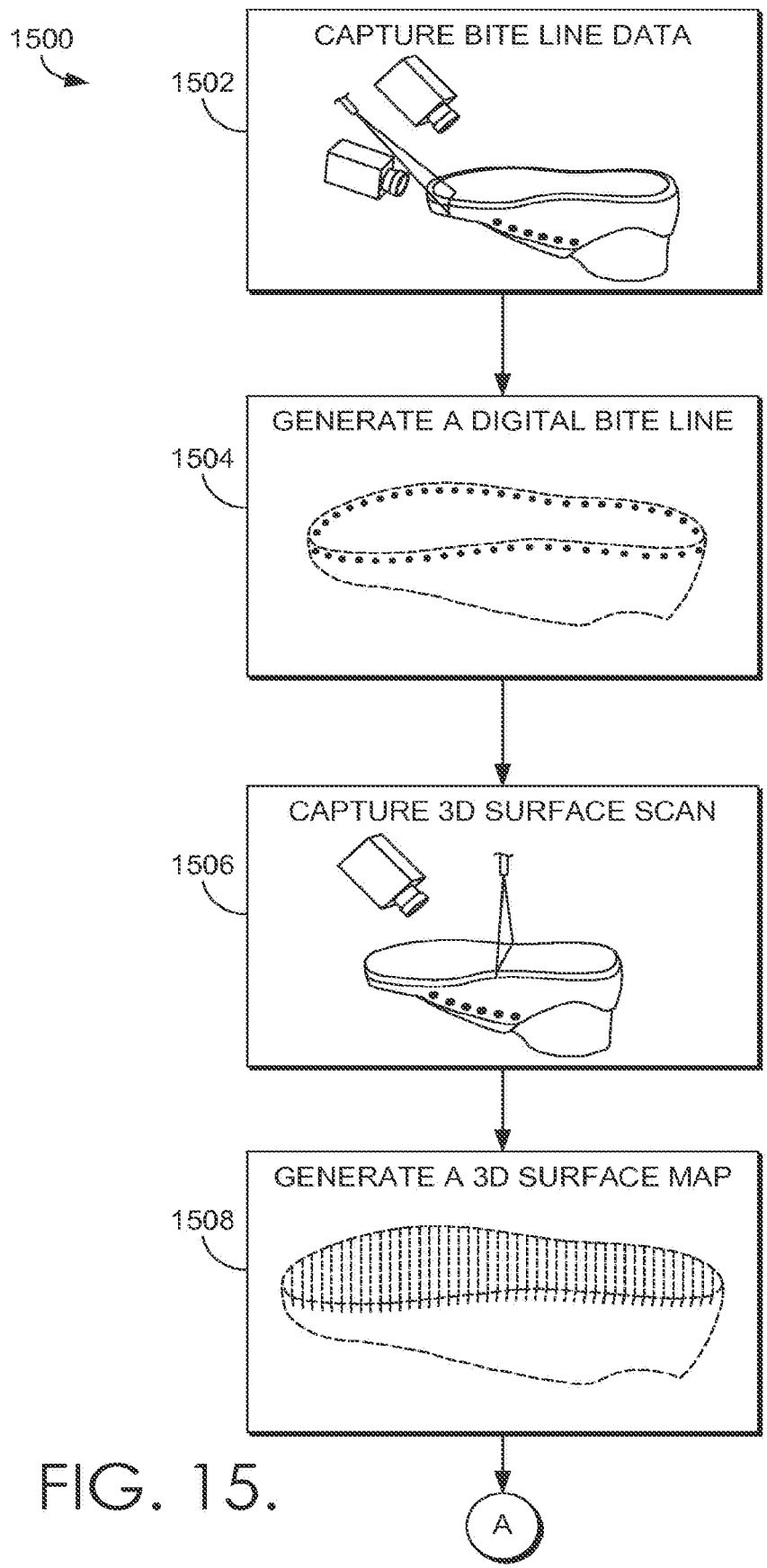
FIG. 15 is a graphical flow diagram illustrating an exemplary method for capturing a three-dimensional surface mapping of a lasted upper and a three-dimensional digital bite line representation for use in generating a robotic tool path in accordance with aspects hereof.
Figure 15:
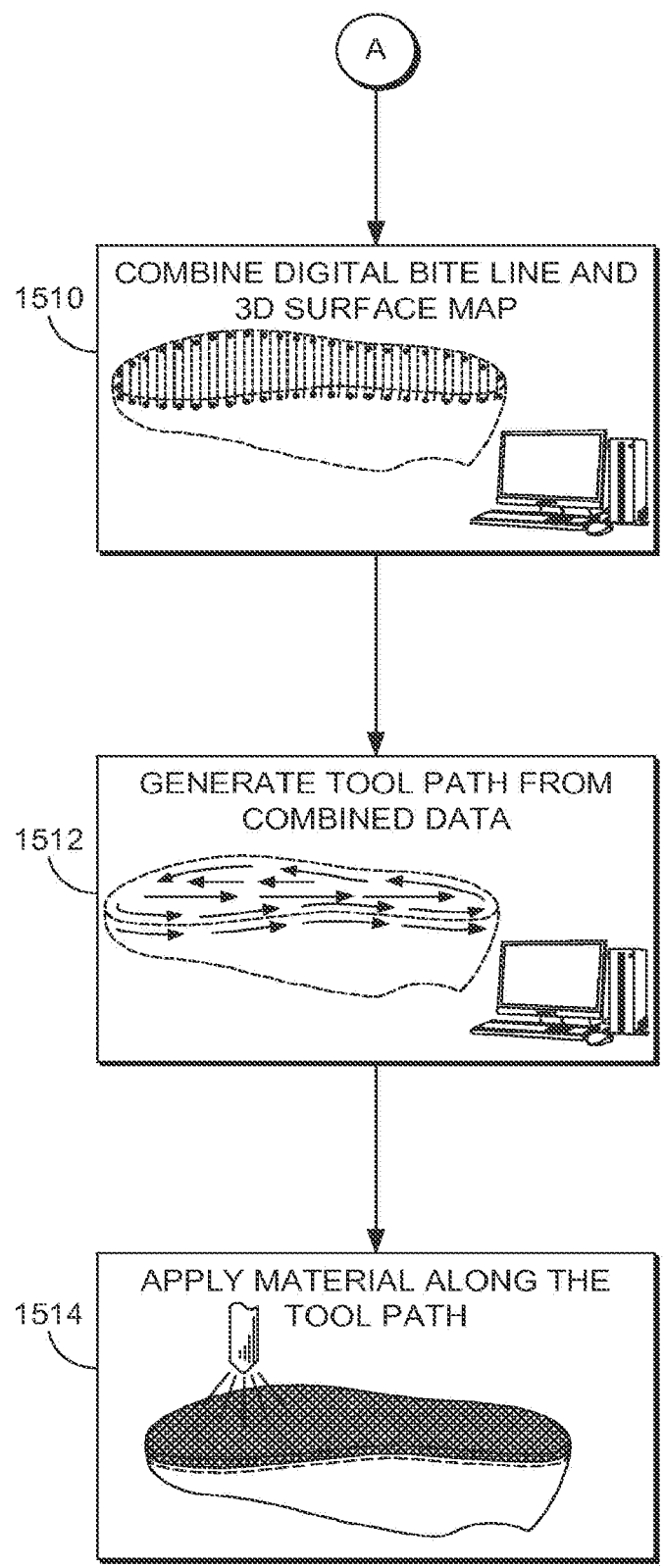

FIG. 15 is a graphical flow diagram illustrating an exemplary method 1500 for capturing a three-dimensional point cloud representation of a portion of a lasted upper and a three-dimensional digital bite line representation for use in generating a robotic tool path. At a step 1502, bite line data is captured. As previously discussed, the capture of bite line data may be accomplished using a variety of techniques, such as scanning a conditionally visible marking with at least one vision system and a light source. For example, the conditionally visible bite line may be formed with an IR material that is responsive to a light source, such as a laser operating in the IR spectrum. At an intersection of the light emitted by the light source and the conditionally visible bite line, indicia may be perceived by the vision system, which identifies a location of the bite line demarcation. As also provided herein, it is contemplated that the bite line data may be captured by a stylus on a multi-axis dimensional measuring device that relies on physical contact between the multi-axis dimensional measuring device and the object to be measured, such as a lasted upper.

Step 1504 provides for the generation of a digital bite line. A computing system may convert the captured bite line data into a three-dimensional representation of points along the bite line. This three-dimensional representation of the bite line captured from the lasted upper may be stored as a grouping of dimensional points that may be input into a vision system software package for eventual generation of a tool path. It is contemplated that the generated digital bite line may extend along one or more portions of the lasted upper, such as various distances along a side portion of the lasted upper and/or along different portions of the bottom (e.g., strobel board location when using a strobel construction) of the lasted upper.

Step 1506 provides for the capture of a three-dimensional surface data from a surface scan along at least a bottom portion of the lasted upper. As provided herein, it is contemplated that one or more cameras in connection with one or more light sources that may be used in tandem to develop a three-dimensional identification of the lasted upper surface(s). As contemplated herein, a laser having a structured light source may traverse the lasted upper bottom portion while at least one camera captures images of the lasted upper and laser light intersection.

Step 1508 generates a three-dimensional surface map of the lasted upper. As provided herein, an exemplary aspect contemplated allows for the data captured in step 1506 to be processed by a computing system to identify a plurality of points along the scanned surface to generate a point cloud, such that the three-dimensional coordinates of points along the scanned surface may be determined relative to one another. In an exemplary aspect, a computing system adapted to operate a vision software program interprets images captured from at least one camera to develop the three-dimensional surface scan. The computing system may use interpolation and other mathematical techniques to develop the resulting surface map such that a more comprehensive surface map is formed from a finite number of data points along the surface region scanned.

Step 1510 combines data representing the digital bite line with data representing the three-dimensional surface map to form a more complete three-dimensional model of the surface region on which a tool will traverse for further processing, such as the application of an adhesive. As discussed previously, the combining of the data representations may be accomplished by a computing system having software adapted for combining the data representation. For example, vision software that may be implemented to align the three-dimensional surface map data with the three-dimensional digital bite line data. This alignment may be accomplished, as is known in the art, based on a previously performed calibration process that allows the computing system to align the relative coordinate positions from a first data set captured in a first physical location (e.g., the bite line scanning component) with the relative coordinate positions from a second data set captured in a second, different, physical location (e.g., surface scanning component). The combined and aligned data from the different data representations is useable to develop a model of the surface region that is to be processed by a created tool path. It is contemplated that the surface region may include additional portions of the lasted upper beyond that which will be processed by the tool following the tool path. As depicted in step 1510, the data representing the digital bite line and the data representing the three-dimensional surface map are joined into a common representation of the surface region for which a tool path will be generated. As discussed above, while the figures and discussion refer to visual depictions of the data representations, a visual model of the data representations may not occur and in an exemplary aspect will not be generated. Further, it is contemplated that the separate data representations may not be actually merged into a common data representation, but instead will be commonly referenced for the generation of the tool path, as provided in step 1512.

Step 1512 generates a tool path along the lasted upper based on the combined data representation from step 1510. As discussed previously, it is contemplated that the tool path will allow a multi-axis robotic-controlled tool to operate in multiple dimensions to process a portion of the lasted upper, such as applying an adhesive. In an exemplary aspect, the generated tool path for a lasted upper based on the combined data representations extends along a bottom portion of the lasted upper as well along a sidewall portion of the lasted upper. Further, it is contemplated that the tool path may include additional instructions for the processing, such as application rate, speed, angle, and other characteristics that are useful in optimizing the processing step to be performed by the tool path. The generated tool path may be generated by a computing system having a program for leveraging the data representations and predetermined criteria to develop an appropriate tool path. For example, the computing system may include one or more files describing a quantity of adhesive, preferred application rate, preferred speed, and other factors affecting the generation of a tool path for an adhesive application.

Step 1514 depicts the execution of the tool path generated at the step 1512. In this example, the tool path allows for the application of a material, such as an adhesive to the lasted upper within a surface region bounded by the digital bite line. However, it is contemplated that additional/alternative processing may be performed by a generated tool path that was generated based on one or more data representations provided herein. For example, stitching, buffing, cutting, painting, scoring, marking, and other processes performed in the construction of a shoe may be implemented in exemplary aspects. As provided herein, the application of material along the generated tool path may include controlling the speed, application rate, angle, and location of an adhesive applicator. The generated tool path may be translated into actual movement by a multi-axis robot having an adhesive application system. An adhesive application system may be comprised of an application portion (e.g., spray nozzle) and the multi-axis robot functionally coupled with a computing system to process a generated tool path for spatial movement and application of an adhesive to a portion of an article of footwear.

While method 1500 depicts a specific sequence of steps, it is contemplated that one or more steps may be rearranged while still effectively accomplishing a generated tool path for a subsequent processing of the lasted upper. For example, it is contemplated that the order in which the bite line data is captured (step 1502), generation of the digital bite line (step 1504), capture of a three-dimensional surface scan (step 1506), and the generation of a three-dimensional surface map (step 1508) may be performed in any order and may be performed in parallel as opposed to in a serial manner as depicted. Further, it is contemplated that additional steps may be included as well as one or more steps may be omitted in an exemplary aspect.

Figure 16:
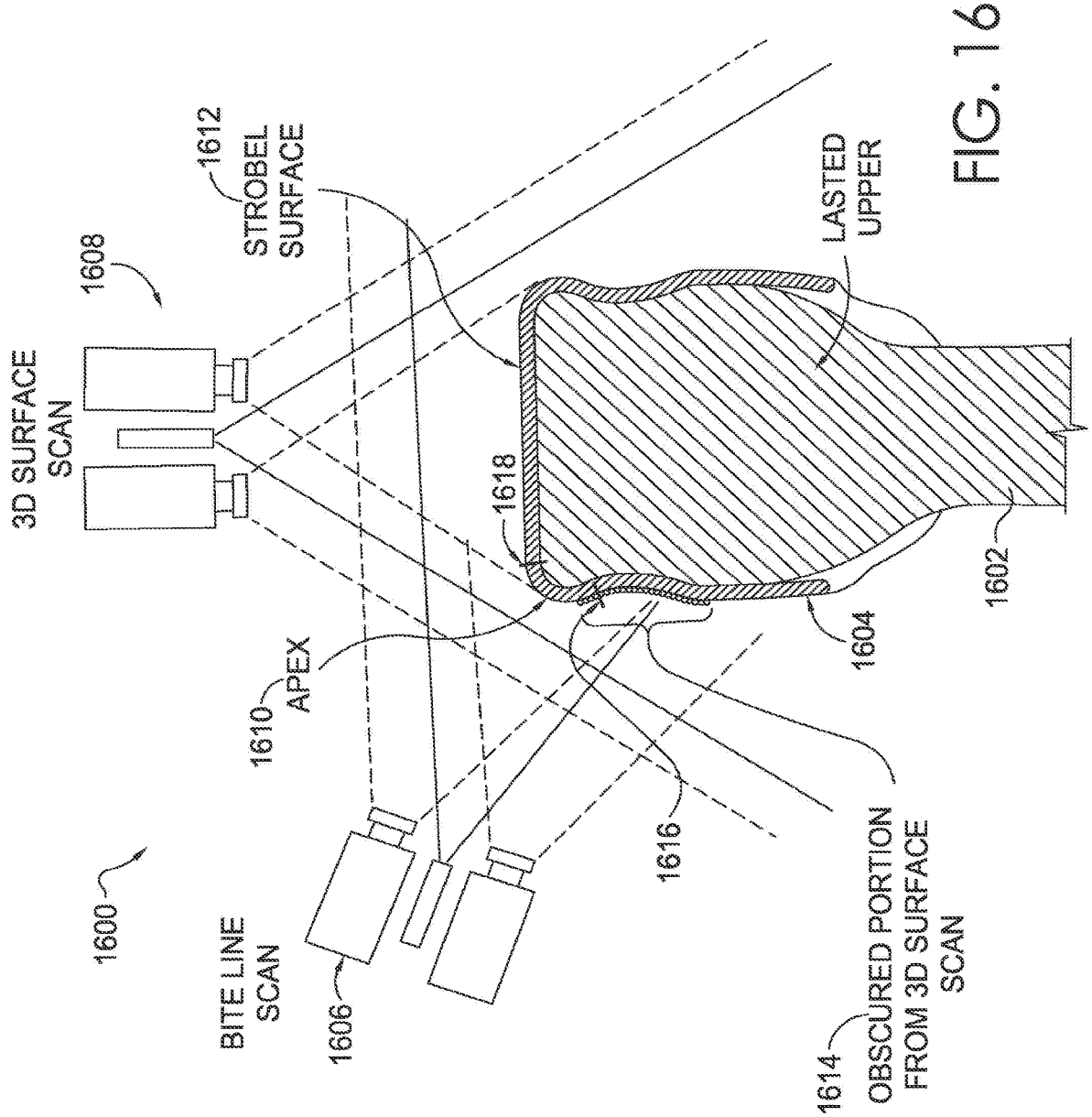
FIG. 16 is a cross sectional view of an exemplary lasted upper as captured by a bite line scanning system and a three-dimensional scanning system, in accordance with aspects hereof.

FIG. 16 is a cross-sectional view 1600 of an exemplary lasted upper 1604 as captured by a bite line scanning system 1606 and a three-dimensional scanning system 1608. In particular, the cross sectional view 1600 illustrates how contours of the lasted upper 1604 as maintained by an exemplary last 1602 may obscure one or more portions of a surface region for which a tool path is to be generated. For example, the lasted upper 1604 is formed with an apex 1610 as the lasted upper 1604 transitions from a bottom surface, such as a strobel surface 1612, to a sidewall portion. As a result of the position of the three-dimensional scanning system 1608 relative to the lasted upper 1604, a portion 1614 (identified by the region having circles) of the lasted upper 1604 is obscured from the field of view captured by the three-dimensional scanning system 1608, as depicted by the dashed lines extending from at least one camera of the three-dimensional scanning system 1608.

In this example, a bite line 1616 may be demarcated in the region 1614 that is obscured from the three-dimensional scanning system 1608. As a result of being obscured, a tool path to be generated may not have sufficient data from the three-dimensional scanning system 1608 to stay within a region defined by the bite line 1616. Consequently, in an exemplary aspect, the bite line scanning system 1606 is relied on to capture a different perspective of the lasted upper 1604 than the three-dimensional scanning system 1608, as depicted by the dashed lines extending outwardly from the digital bite line system 1606 representing the field of view of the digital bite line system 1606. In an exemplary aspect, it is contemplated that the data acquired from the digital bite line system 1606 is used, in part, to define a boundary in which an interpolation techniques may be used with data from the three-dimensional scanning system 1608 to determine a surface in the obscured portion. Further, in another exemplary aspect, a data representation from the digital bite line system 1606 may be combined with data from the three-dimensional scanning system 1608 to generate a tool path including the obscured region 1614.

An alternative bite line 1618 is also depicted within the field of view of both the three-dimensional scanning system 1608 and the digital bite line system 1606. In this example, it is contemplated that the three-dimensional scanning system 1608 may not be adapted to capture to bite line data; therefore, the digital bite line system 1606 may again be relied on to generate the digital bite line data representation. For example, if a conditionally visible bite line is used that is not perceptible to the three-dimensional scanning system 1608, the digital bite line system 1606 may be used.

While the three-dimensional scanning system 1608 and the digital bite line system 1606 are depicted together, it is contemplated that the three-dimensional scanning system 1608 may be in a first physical location that is independent from the digital bite line system 1606 such that a serial capture of data is performed at the different location. However, it is also contemplated that the three-dimensional scanning system 1608 and the digital bite line system 1606 may be positioned in a common location for data collection without transferring the lasted upper 1604 from a first location to a second location, as contemplated in FIGS. 8-10 herein.

Methods and/or systems in accordance herewith may use one or more computing systems executing computer-readable code retained in a computer-readable memory to perform the appropriate steps and/or to control the various components of systems in accordance with the present invention. Different steps in a process or method in accordance herewith may occur at different locations and/or may be controlled by different computing systems, and different components of a system in accordance herewith may be controlled by different computing systems. For example, the creation of a virtual bite line may occur at a first station using a first computing system, while the scanning of the surface of a lasted upper to collect three-dimensional profile data may occur at a second station and may be controlled by a second computing system.

Further, in some examples the corresponding bottom unit (or representation thereof) that is used for marking a bite line, whether digital or comprising perceivable indicia, may be different than the bottom unit that is ultimately bonded to a given upper. In many examples, a bite line may be generated using the bottom unit that will ultimately be bonded to the upper, but this is not necessary. For example, a representative bottom unit may be used at a station to generate a bite line while a sole sufficiently similar at the bite line to the representative bottom unit may ultimately be bonded to the upper.

Further, a variation in either the bottom unit used or the amount of force used to mate a lasted upper to a corresponding bottom unit (or representation thereof) may provide advantages in some examples of systems and methods in accordance herewith. For example, if a first amount of predetermined force will be used in bonding a lasted upper to a corresponding bottom unit, a lesser or greater second amount of force may be used to retain the lasted upper to the corresponding bottom unit for the marking of a bite line. In the example of a bottom unit that comprises a compressible foam material, such as in a midsole, the use of less pressure in mating an upper to a bottom unit to create a bite line than used in the bonding process may permit the bite line to readily encompass all of the zone that will ultimately be covered by the sole when the sole is bonded to the lasted upper. Similarly, a representative bottom unit that is softer or harder than the actual bottom unit may be used to mark a bite line defining a zone that is either larger or smaller than the surface region ultimately covered by a bottom unit bonded to the upper.

From the foregoing, it will be seen that this invention is one well adapted to attain all the ends and objects hereinabove set forth together with other advantages which are obvious and which are inherent to the structure.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative and not in a limiting sense.

What is claimed is:

1. A system for processing shoe parts, the system comprising:
   a marking mechanism operable for marking an indicia on a shoe upper at a bite line, the bite line substantially surrounding an area on the shoe upper that is covered by a shoe bottom unit upon assembly of the shoe upper and the shoe bottom unit;
   a light source that is operable to project light across the shoe upper and/or the shoe bottom unit;
   a first camera that is operable to capture a first series of images depicting the light reflecting off of at least the bite line marked by the indicia;
   a second camera that is operable to capture a second series of images depicting the light reflecting off of at least the area that is covered by the shoe bottom unit upon assembly of the shoe upper and the shoe bottom unit, wherein the first camera and the second camera are oriented to capture images of the shoe upper from different perspectives;

a computer system that is operable to generate a tool path for processing the area of the shoe upper using the first series of images and the second series of images; and a manufacturing tool that is operable to apply a manufacturing process to the shoe upper using the generated tool path, such that the manufacturing process is applied to the area of the shoe upper that is substantially surrounded by the bite line.

2. The system of claim 1, wherein the manufacturing tool comprises a multi-axis robot having an adhesive-applying tool head.

3. The system of claim 1, wherein the marking mechanism uses a conditionally visible marking agent.

4. The system of claim 3, wherein the conditionally visible marking agent is visible when illuminated by an ultraviolet light spectrum.

5. The system of claim 3, wherein the conditionally visible marking agent is visible when illuminated by an infrared light spectrum.

6. The system of claim 1, wherein the light source comprises a laser.

7. The system of claim 1, wherein the first camera is positioned to capture images of a region of the shoe upper that is obscured from the second camera.

8. The system of claim 7, wherein the region comprises a recess along a sidewall portion of the shoe upper.

9. The system of claim 1, further comprising a last that supports the shoe upper.

10. The system of claim 1, wherein the manufacturing tool is configured for adhesive application.

11. The system of claim 1, wherein the manufacturing tool is configured for stitching.

12. The system of claim 1, wherein the manufacturing tool is configured for buffing.

13. The system of claim 1, wherein the manufacturing tool is configured for cutting.

14. The system of claim 1, wherein the manufacturing tool is configured for scoring.

* * * * *